United States Patent
Oka et al.

(12) 
(10) Patent No.: US 6,403,497 B1
(45) Date of Patent: Jun. 11, 2002

(54) METHOD OF MANUFACTURING SEMICONDUCTOR DEVICE BY TWO STAGE HEATING OF DEPOSITED NONCRYSTALLINE SEMICONDUCTOR

(75) Inventors: Hideaki Oka; Satoshi Takenaka; Masafumi Kunii, all of Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/568,917

(22) Filed: May 10, 2000

Related U.S. Application Data

(62) Division of application No. 07/790,107, filed on Nov. 7, 1991, now Pat. No. 6,235,563, which is a continuation of application No. 07/479,396, filed on Feb. 13, 1990, now abandoned.

(30) Foreign Application Priority Data

| Feb. 14, 1989 | (JP) | 1-34140 |
| Mar. 27, 1989 | (JP) | 1-74229 |
| Mar. 27, 1989 | (JP) | 1-74230 |
| Jun. 5, 1989 | (JP) | 1-142470 |
| Oct. 4, 1989 | (JP) | 1-259393 |
| Nov. 21, 1989 | (JP) | 1-302862 |

(51) Int. Cl.$^7$ .................... H01L 21/31; H01L 21/469
(52) U.S. Cl. .................... 438/770; 438/482; 438/485; 438/486; 438/762
(58) Field of Search .................... 438/762, 770, 438/482, 485, 486

(56) References Cited

U.S. PATENT DOCUMENTS

| 3,883,372 A | 5/1975 | Lin |
| 4,129,463 A | 12/1978 | Cleland et al. |
| 4,214,918 A | 7/1980 | Gat et al. |
| 4,249,957 A | 2/1981 | Koliwad et al. |

(List continued on next page.)

FOREIGN PATENT DOCUMENTS

| DE | 3241959 A1 | 5/1983 |
| EP | 0 261 666 | 3/1988 |
| EP | 0 296 747 | 12/1988 |

(List continued on next page.)

OTHER PUBLICATIONS

P. Kwizera, et al., "Annealing Behavior of Thin Polycrystalline Silicon Films Damaged by Silicon Ion Implantation in the Critical Amorphization Range", *Thin Solid Films*, vol. 100, pp. 227–233 (1983).

(List continued on next page.)

*Primary Examiner*—Michael J. Sherry
*Assistant Examiner*—Asok Kumar Sarkar

(57) ABSTRACT

A polycrystalline or polysilicon film having large grain size, such as 1 µm to 2 µm in diameter or greater, is obtained over the methods of the prior art by initially forming a silicon film, which may be comprised of amorphous silicon or micro-crystalline silicon or contains micro-crystal regions in the amorphous phase, at a low temperature via a chemical vapor deposition (CVD) method, such as by plasma chemical vapor deposition (PCVD) with silane gas diluted with, for example, hydrogen, argon or helium at a temperature, for example, in the range of room temperature to 600° C. This is followed by solid phase recrystallization of the film to form a polycrystalline film which is conducted at a relatively low temperature in the range of about 550° C. to 650° C. in an inert atmosphere, e.g., N or Ar, for a period of about several hours to 40 or more hours wherein the temperature is gradually increased, e.g., at a temperature rise rate below 20° C./min, preferably about 5° C./min, to a prescribed recrystallization temperature within the range about 550° C. to 650° C. Further, between the step of film formation and the step of solid phase recrystallization, the film may be thermally treated at a relatively low temperature, e.g., over 300° C. and preferably between approximately 400° C. to 500° C. for a period of several minutes, such as 30 minutes, to remove hydrogen from the film prior to solid phase recrystallization.

13 Claims, 13 Drawing Sheets

U.S. PATENT DOCUMENTS

| | | | |
|---|---|---|---|
| 4,292,091 A | * 9/1981 | Togei | 438/413 |
| 4,314,595 A | 2/1982 | Yamamoto et al. | |
| 4,377,605 A | * 3/1983 | Yamamoto | 438/770 |
| 4,432,809 A | 2/1984 | Chye et al. | |
| 4,448,632 A | 5/1984 | Akasaka | |
| 4,460,417 A | * 7/1984 | Murase et al. | 438/365 |
| 4,471,523 A | 9/1984 | Hu | |
| 4,514,895 A | 5/1985 | Nishimura | |
| 4,552,595 A | 11/1985 | Hoga | |
| 4,565,584 A | 1/1986 | Tamura et al. | |
| 4,581,814 A | 4/1986 | Celler et al. | |
| 4,597,160 A | 7/1986 | Ipri | |
| 4,597,804 A | 7/1986 | Imaoka | |
| 4,693,759 A | 9/1987 | Noguchi et al. | |
| 4,751,196 A | 6/1988 | Pennell et al. | |
| 4,772,486 A | 9/1988 | Ishihara et al. | |
| 4,814,292 A | 3/1989 | Sasaki et al. | |
| 4,851,370 A | * 7/1989 | Doklan et al. | 438/762 |
| 4,868,140 A | 9/1989 | Yonehara | |
| 4,905,072 A | 2/1990 | Komatsu et al. | |

FOREIGN PATENT DOCUMENTS

| | | | |
|---|---|---|---|
| GB | 2131407 A | * 6/1984 | |
| JP | 56-158431 | 12/1981 | |
| JP | 58-79718 | 5/1983 | |
| JP | 63-10573 | 1/1988 | |
| JP | 63-42112 | 2/1988 | |
| JP | 2-81421 | 3/1990 | |

OTHER PUBLICATIONS

G. N. Parsons, et al., "Defects in a–Si:H Films Produced by Remote Plasma Enhanced Chemical Vapor Deposition", *Journal of Non–Crystalline Solids*, vol. 107, pp. 295–300 (1989).

N. Sax and R. Lewis, Sr., *Hawley's Condensed Chemical Dictionary*, 11$^{th}$ Ed. (1987) Van Nostrand Reinhold Co., pp. 562, 563, 164.

T. Noguchi, et al, "Low Temperature Polysilicon Super–Thin–Film Transistor (LFST)", *Japanese Journal of Applied Physics*, vol. 25(2), pp. L121–L123 (Feb. 1986).

A. C. Ipri, et al., "Polysilicon Transistors Fabricated on Plasma–Deposited Amorphous Silicon", *IEEE Transactions on Electron Devices*, vol. 35(5), pp. 708–710 (May 1988).

P. Kwizera et al., "Solid Phase Epitaxial Recrystallization of Thin Polysilicon Films Amorphized By Silicon Ion Implantation", *Applied Physics Letters*, vol. 41(4), pp. 379–381, Aug. 15, 1982 (Including vol./No. content page).

* cited by examiner

METHOD OF MANUFACTURING SEMICONDUCTOR DEVICE BY TWO STAGE HEATING OF DEPOSITED NONCRYSTALLINE SEMICONDUCTOR

CONTINUING APPLICATION DATA

This application is a divisional of U.S. patent application Ser. No. 07/790,107, filed Nov. 7, 1991, now U.S. Pat. No. 6,235,563 which is a continuation of Ser. No. 07/479,396, filed Feb. 13, 1990, now abandoned, each of which is incorporated herein in its entirety by reference.

BACKGROUND OF THE INVENTION

1. Field of the Invention

This invention relates generally to a semiconductor device and a method of manufacturing the same and, in particular, to a method of manufacturing semiconductor devices having a thin film formed on an insulating support, such as a substrate or support layer, and, further, to the formation of thin film transistors (TFTs) on insulating supports for large area image arrays, such as liquid crystal display panels.

2. Description of the Related Art

Studies and experiments have been performed to form a high quality semiconductor films, devices, and IC structures on insulating supports, such as, insulating substrates, for example, glass, quartz, or the like and on amorphous layers, for example, $SiO_2$, $Si_3N_4$, and the like.

In recent years, expectations and desires for improved high quality semiconductor silicon devices and IC structures formed on these insulating supports has continually increased. Examples of applications are large area, high resolution liquid crystal display panels and devices; high speed, high resolution contact type image sensors; three dimensional ICs, and other IC structures. Therefore, the development of a method that will consistently and reliably form high quality silicon thin films on an insulating support is under intensive research and development.

Relative to semiconductor materials, a polycrystalline or polysilicon silicon TFT device has a higher field effect mobility than an amorphous silicon TFT device and the amount of ON current of a polysilicon TFT is much greater than that of an amorphous TFT. However, the mobility of present polysilicon TFTs is still lower than that of monocrystalline TFT devices because of many barriers around the boundaries of crystal gains in the polysilicon material. In the case of the above mentioned applications, it is highly desirable to increase the level of mobility of polysilicon TFT devices to approach that of monocrystalline silicon. In order to obtain such higher levels of mobility in polysilicon TFT devices, the grain size diameter of the polysilicon should be increased from around 500 Å to several 1,000 Å, which is in the range of reproducibility in the present state of the art, to about 1 $\mu$m or greater.

Relative to the formation of thin film transistors (TFTs) on insulating structures, the following general methods have been studied and developed: (1) The formation of TFTs employing amorphous silicon as the semiconductor material fabricated by plasma CVD or low pressure chemical vapor deposition (LPCVD) or a similar process, (2) TFTs employing polycrystalline silicon as the semiconductor material fabricated by chemical vapor deposition (CVD), LPCVD, plasma enhanced chemical vapor deposition (PECVD) or similar process, and (3) TFTs employing single crystal or monocrystallized silicon as the semiconductor material fabricated by melting recrystallization or such similar process.

However, the realization of high quality TFTs has been very difficult because the field effect mobility of TFTs comprising amorphous silicon or polycrystalline silicon is substantially lower than that of TFTs comprising single crystal silicon. For example, relative the conventional methods of (1) and (2), the field effect mobility for amorphous silicon TFTs is typically below 1 $cm^2$/V·sec and for conventional polycrystalline silicon TFT is approximately or less than 10 $cm^2$/V·sec. Thus, high speed operational characteristics have not been realized by the employment of these methods. On the other hand, in the case of the method (3), melting recrystallization, wherein a laser beam is utilized to bring about recrystallization, higher mobilities have been achieved, such as in the hundreds of $cm^2$/V·sec. However, there are problems associated with this technique due to the use of very high temperatures in processing and, furthermore, the technique has not been sufficiently developed to lend itself to mass production of semiconductor devices, particularly, the mass production of hundreds to thousands of active elements on a large area insulating supports, such as glass substrates for large area image devices, e.g., liquid crystal display panels.

Recently, the method of forming large grain polycrystalline silicon layers or films by solid phase recrystallization has been pursued and research employing this method has been proceeding in recent years. One of the principal reasons for the interest in solid phase recrystallization is the advantage in using lower processing temperatures compared to melting recrystallization. Examples of studies relating to solid phase recrystallization processing are found in the articles of P. Quizzer et al., "Annealing Behavior of Thin Polycrystalline Silicon Films Damaged by Silicon Ion Implantation in the Critical Amorphous Range", *Thin Solid Films*, Vol. 100(3), p. 227–233, (1983), and T. Noguchi et al., "Low Temperature Polysilicon Super-Thin-Film Transistor (LSFT), *Japanese Journal of Applied Physics*, Vol. 25(2), p. L121-L123, February, 1986 and in U.S. Pat. No. 4,693,759.

Generally, the conventional method of solid phase recrystallization relative to the formation of TFTs and other such active elements is that, first, a polycrystalline silicon film is formed by LPCVD or PECVD employing $SiCl_4$, $SiH_4$ or the like. Next, the polycrystalline silicon film is amorphized by a $Si^+$ ion implantation. Then, the converted amorphous film is heat treated, for example, at approximately 600° C. in a nitrogen atmosphere in excess of 30 hours and, preferably nearly 100 hours to produce large gain polysilicon. Finally, the polysilicon film is patterned into a TFT device using conventional photolithography techniques. However, the practice of this method has the following disadvantages: (1) The process is complicated by the requirement that the formed polycrystalline silicon layer must be amorphized before further treatment, which naturally increases manufacturing costs. (2) This amorphization is accomplished with expensive ion implantation system, which is necessary to perform the implantation operation. (3) The required heat treatment period is comparatively a very long period of time, in many cases as long as nearly 100 hours to achieve the largest grain size possible. (4) It is very difficult to handle large insulating substrates, such as, for example, 30 cm×30 cm, and obtain uniform results across a deposited and heat treated thin film on such a substrate. (5) The crystallized volume fraction, i.e., the crystal to overall volume ratio in the recrystallized film, is low after performing solid phase recrystallization. Therefore, it is very difficult to fabricate a high quality active elements on large area substrates employing conventional methods of solid phase recrystallization.

OBJECTS OF THE INVENTION

It is an object of this invention to provide a low temperature method of forming polycrystalline thin films on an insulating support having high polycrystalline quality, larger crystal grains and good crystal grain orientation.

It is another object of the present invention to provide semiconductor devices, such as TFTs, having high speed operational characteristics and higher field effect mobility compared with such devices made by conventional methods.

It another object of this invention to provide a semiconductor device which comprises a polycrystalline silicon thin film formed on an insulating support characterized by large grains, high crystallized volume fraction and reduction of the Si/SiO$_2$ interface state density.

It is another object of this invention to provide a method for the manufacture of a thin film polysilicon semiconductor that is simpler in implementation with resulting higher manufacturing reproducibility and yields compared to prior conventional methods.

It is still a further object of this invention to provide a polysilicon thin film on an insulating medium having high field effect mobility suitable for large are IC applications, such as large area TFT arrays for LCD panels.

SUMMARY OF THE INVENTION

According to this invention, an improved polycrystalline or polysilicon film having large grain size, such as, 1 $\mu$m to 2 $\mu$m in diameter or greater, is obtained over the methods of the prior art by initially forming a silicon film, which may be comprised of amorphous silicon, or micro-crystalline silicon, or contains micro-crystal regions in the amorphous phase (hereinafter also referred to as "noncrystalline"), at a low temperature via a chemical vapor deposition (CVD) method, such as by plasma chemical vapor deposition (PCVD) with silane gas diluted with, for example, hydrogen, argon or helium at a temperature, for example, in the temperature range from temperature 600° C. This is followed by solid phase recrystallization of the film to form a polycrystalline film which is conducted at a relatively low temperature in the range of about 550° C. to 650° C. in an inert atmosphere, e.g., N or Ar, for a period of about several hours to 40 or more hours preferably the temperature is gradually increased, e.g., at a temperature rise rate below 20° C./min, preferably about 5° C./min, to a prescribed recrystallization temperature within the range about 550° C. to 650° C.

Further, between the step of forming the film and the step of solid phase recrystallization, the film may be thermally treated at a relatively low temperature, e.g., over 300° C. and preferably between approximately 400° C. to 500° C. for a period of several minutes, such as 30 minutes, to remove most of the hydrogen from the film prior to recrystallization, since hydrogen included in the silicon film disturbs and suppresses the formation of large crystal grain sizes during subsequent solid phase recrystallization treatment to form a polycrystalline film. Also, if the formation of the noncrystalline film by CVD deposition is carried at a substrate temperature in the range of about 150° C. to 200° C. which is particularly desirable, during the process of solid phase recrystallization, larger crystal grains will be formed and the possibility of release of the film from the substrate is less likely to occur. The prepared polycrystalline film may then be utilized for TFT gate electrodes. After formation of the gate oxidation layer, the gate electrode may be formed, followed by formation of defined source and drain regions to complete the manufacture of a TFT device. The resultant field effect mobility of an n channel, polycrystalline silicon TFT formed in accordance with the method of this invention is 150 cm$^2$/V·sec to 200 cm$^2$/V·sec and greater.

Further, the method of this invention comprises the thermal oxidation of a polysilicon film to form a gate oxidation layer or file on it surface wherein the temperature is increased gradually, e.g., below about 20° C./min, preferably at about 5° C./min, to the thermal oxidation temperature in the range of about 1,000° C. to 1,200° C.

Thus, polycrystalline silicon films with large grains and high crystallized volume fraction can be produced by employing a simpler manufacturing process. As a result, it is possible to form high quality semiconductor active elements on insulating materials, thereby making it possible to produce large size, high resolution liquid crystal display panel; high speed, high resolution contact type image sensors; three dimensional ICs; and the like.

Also, according to the method of this invention, there are following additional attributes. In the case of an undoped channel region in the past, it was necessary to dope the impurity, for example, boron, in the channel region via ion implantation, since the characteristics of the active region of an n channel polycrystalline silicon TFT tend to shift to the depletion side, and of a p channel polycrystalline silicon TFT to the enhancement side. On the other hand, according to this invention, since a doped polycrystalline silicon layer can be obtained by doping impurities, such as boron or the like, at the time of film growth and, then, thereafter solid phase recrystallization performed on the doped film, employment of expensive equipment, such as an ion implantation system, is not necessary and, further, there is no necessity to increase the number of processing steps, which is a cost effective advantage. For example, if an impurity in the concentration range of about $10^{15}$/cm$^3$ to $10^{19}$/cm$^3$ are doped at the channel region prior to formation of the gate electrode of TFT device, this shift in V$_{th}$ can be suppressed so that impurities in channel region can be employed to control threshold voltage, V$_{th}$ and minimize cut off current. Alternatively, by doping impurities during the film growth prior to solid phase recrystallization in order to control V$_{th}$, an increased ON current for p channel TFT's can be obtained beside minimized cut off current.

Also, according to the method of this invention, reduction of gate interconnect resistance can be easily achieved with a simple treatment process. High gate interconnect resistance has been a problem in active TFT, large LCD panels and this resistance can be reduced by the practice of this invention more easily enabling the fabrication of liquid crystal display panels with applicability also to HDTV panels. Further, this invention is also effective as applied to a contact type image sensors wherein the scanning circuit and electro-optic transducer are integrated on a single substrate achieving higher read scan rates and higher resolution. It is possible to make a wider contact type image sensor because of the reduction of the gate interconnect resistance enabling larger size image sensors. For example, a high speed scanner with a contact type image sensor having an electro-optic transducer and scanning circuit integrated in a single chip manufactured according to this invention can have a scanning rate equal to or in excess of 1 ms/line, in the case of an A4size scanned medium, and having a resolution of 400 DPI or greater. Also, this circuit can be operated at lower source voltage levels of about 5 V to 10 V compared to previous levels of about 16 V. By the same token, application of this invention are also easily applicable to TFT driven liquid crystal shutter arrays, TFT driven thermal heads, three dimensional ICs or the like.

Further, polycrystalline silicon films with large grains can be formed by employing shorter thermal treatment periods by a combination of films wherein one film crystalline seeds are easily generated by solid phase recrystallization and in another film crystalline seeds are difficult to generate by solid phase recrystallization. Further, by forming a film wherein crystalline seeds are easily generated by the employment of a relatively high temperature plasma CVD process, polycrystalline silicon with large grains with uniform direction of orientation, such as <110>, or silicon with small crystalline grains in the amorphous phase can be achieved with a thermal treatment of a relatively short duration. As a result, improvements in field effect mobility and reduction of $Si/SiO_2$ interface state density are realized in the employment of this invention. In particular, two different silicon films are formed by plasma CVD method on the same support wherein one film is formed at a relatively higher temperature, e.g., in the range of about 400° C. to 800° C. in order to possess a relatively high polycrystalline seed generation rate, and another film is formed at a relatively lower temperature, e.g., in the range of about 150° C. to 300° C., in order to possess a relatively low polycrystalline seed generation rate. Thus, the polycrystalline seed generation ratio of the latter film is lower than that of the former film. This enables a polycrystalline film to be formed by solid phase recrystallization in a relatively short thermal treatment period that has large crystal grain sizes. The role of the crystalline seeds is to lower activation energy of transforming amorphous to crystalline silicon thereby rendering a shorter annealing time and to control crystal orientation of the formed polycrystalline silicon film. The field effect mobility of a high temperature processed n channel TFT manufactured according to the method of this invention is greater than about 200 $cm^2/V·sec$, thereby providing for a high quality TFT.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts.

DESCRIPTION OF THE PREFERRED EMBODIMENTS

Various specific embodiments will now be described relative to the method of this invention relative to active semiconductor devices in the form of TFTs as shown in FIGS. 1, 4, 5 and 6. However, the method of this invention is equally applicable to other active semiconductor elements, such as bipolar transistors, static induction type transistors, electro-optic transducers, e.g., solar cells and optical sensor devices and arrays.

Reference is now made to FIGS. 1A–1D which illustrate one example of the manufacturing process of a semiconductor device employed in a first embodiment of this invention comprising the formation of a thin film transistor (TFT) shown in FIG. 1.

Figure 1A:
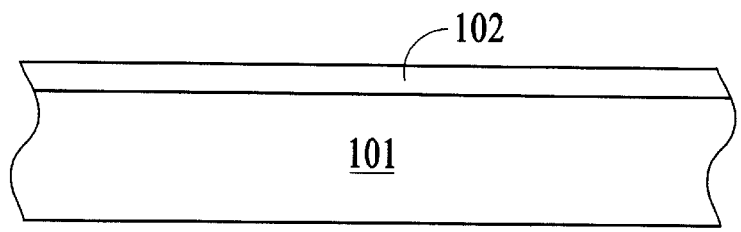
FIGS. 1A–1D illustrate a series of manufacturing steps in the manufacture of a semiconductor device in carrying out one embodiment of the method comprising this invention.
Figure 1B:
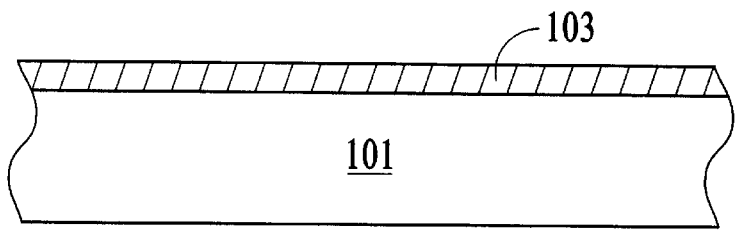

As shown in FIG. 1A, a silicon layer or film 102 is formed on insulating support 101, such as an insulating substrate, for example, glass, quartz or the like or an amorphous layer, for example, $SiO_2$, $Si_3N_4$ or the like. Also, other insulating crystalline supports may be employed, such as a sapphire substrate ($Al_2O_3$) or substrates of $MgO·Al_2O_3$, $CaF_2$ or the like. Film 102, for the most part, is amorphous silicon or micro-crystalline silicon or contains micro-crystal regions in the amorphous phase, which is generally referred to in the disclosure as a noncrystalline film.

One example of the growth of noncrystalline film 102 is by. plasma CVD (PCVD) discharge. Substrate 101 is placed in the reactor of the CVD system and the temperature of substrate 101 is maintained in the range from about room temperature to 600° C. Silane gas, e.g., $SiH_4$, is diluted with, for example, hydrogen, argon or helium, is introduced into the reactive chamber and rf power is applied to dissociate the gas and a silicon layer is formed on substrate 101 having a thickness in the range of about 100 Å to 2,000 Å.

An amorphous silicon film formed by plasma CVD contains less contaminants, e.g., oxygen, nitrogen or carbon, compared to the amorphous silicon film formed by electron beam evaporation or LPCVD. Thus, a polycrystalline film with high purity has been obtained by performing solid phase recrystallization on an amorphous silicon film formed by plasma CVD.

Also, less contaminants in an amorphous silicon film makes it easy to promote solid phase recrystallization, which results in obtaining a polycrystalline silicon film with a large grain size. In particular, the amorphous silicon deposited in the temperature range of about 150° C. to 350° C. contains the lowest amount of contaminants, which are derived from an insulating support and the PCVD reaction chamber. On the other hand, the amorphous silicon deposited in the temperature range of about room temperature to 150° C. easily releases hydrogen via thermal treatment so that the thermal treatment time may be short.

The amount of carbon and oxygen in an amorphous silicon film formed by PCVD may be reduced to the order of $10^{17}/cm^{-3}$ to $10^{18}/cm^{-3}$. In particular, the amount of carbon and oxygen may be reduced to less than $10^{16}$ $cm^{-3}$ by improving the purity of the gas source and suppressing the generation of contaminants from the inner walls of the PCVD reaction chamber.

It should be noted that other methods may be employed for forming film 102. In any case, the optimum parameters of the thermal treatment applied after film formation for solid phase recrystallization may be dictated by what method of film formation is employed.

Next, thermal treatment is performed on noncrystalline silicon film 102 to convert the film to a polycrystalline silicon film 103 by means of solid phase recrystallization, illustrated in connection with FIG. 3. As previously indicated, the best conditions for thermal treatment differ depending upon the method of forming and the nature of silicon film 102. For example, depending upon the substrate temperature when film 102 is grown by plasma CVD, there are the following differences:

(1) A noncrystalline silicon film 102 formed while the substrate temperature is in the range between room temperature and 150° C., which is a relatively low temperature range, is deposited as amorphous silicon containing a large amounts of hydrogen. However, hydrogen in film 102 can be removed by a subsequent thermal treatment at a temperature below that necessary for removal in the case of a film formed while the substrate temperature in the range between approximately 200° C. to 300° C. One example of such a thermal treatment is the annealing of the amorphous silicon film before vacuum is broken in the film forming system. Since an amorphous film formed at these low temperatures is porous in nature, oxygen and other contaminants will enter into the film upon removal of the structure from the reactor system resulting in a low quality film. However, if the film is given proper thermal treatment before it is taken out of the reactor, then the film will become dense in nature preventing oxygen and other contaminants from entering into the film. The desirable thermal treatment temperature for this purpose is over 300° C. and, if the temperature is increased between approximately 400° C. to 500° C., substantially effective results can be achieved. However, it should be noted that, even when the thermal treatment temperature is below 300° C., film densification can still be achieved, although not as effectively.

In the case wherein subsequent annealing for the purposes of solid phase recrystallization is performed in the same film forming apparatus without breaking vacuum, the annealing step for purpose of film densification can be omitted.

Next, the step of solid phase recrystallization is performed on amorphous silicon film 102 with a relatively low temperature thermal treatment in the range of about 550° C. to 650° C. for a period of about several hours to 20 hours. Both hydrogen removal and crystal growth concurrently occur during the treatment and polycrystalline silicon is formed comprising large grain sizes of about 1 to 2 $\mu$m in diameter or greater. It is preferred that the temperature of annealing for achieving both enhanced density and solid phase recrystallization is not increased or elevated rapidly to the prescribed temperature for solid phase recrystallization. This is because hydrogen dissipation from the film begins to occur as the temperature rises, especially when the temperature exceeds 300° C. If the rate of temperature rise to the prescribed temperature for solid phase recrystallization is performed too rapidly, the formation of defects in the film will more easily occur. In some cases pin holes may appear and other cases film separations will appear. We have determined that if the temperature is gradually increased by a rate below 20° C./min., preferably, an increasing temperature rise rate below 5° C./min., particularly where the treatment temperature exceeds 300° C., the formation of defects in the film will be less. A more detailed explanation of the method of gradient increase of the treatment temperature to the annealing period for solid phase recrystallization will be described a little later.

(2) The amount of hydrogen in film 102 is less if the film is formed when the substrate temperature is in the range of 150° C. to 300° C. compared to an amorphous silicon film formed at a lower temperature, as just described above. However, the temperature at which the dissipation of hydrogen effectively occurs from the film is at a higher temperature. Since a film formed at a temperature between 150° C. to 300° C. is more dense compared to the film formed at lower temperature, the step of annealing to achieve densification of the film may be omitted.

When solid phase recrystallization is next performed at a temperature in the range of approximately 550° C. to 650° C. for a period of about several hours to 40 hours or more, both hydrogen removal and crystal growth concurrently occur and polycrystalline silicon is formed comprising large grain sizes of about 1 to 2 $\mu$m in diameter or greater. The amount of annealing time for solid phase recrystallization lies mainly in the amount of time necessary to remove hydrogen from the amorphous silicon film since a film deposited at a lower substrate temperature, such as in the range of about 150° C. to 300° C., releases hydrogen in a shorter annealing time.

As previously indicated in (1) above, if the treatment temperature is gradually increased by a rate below 20° C./min., preferably, an increasing temperature rise rate below 5° C./min., particularly when the annealing temperature is over 300° C., the formation of defects in the film will be less. Also, if the noncrystalline film is formed with a substrate temperature of about 150° C. to 200° C., which is particularly desirable during the solid phase recrystallization process, large crystal grains will be formed and the possibility of release of the film from the substrate is less likely to occur, which film release may possibly occur during the gradual increase temperature rise process employed in the solid phase recrystallization of this invention if accomplished too rapidly.

(3) Although hydrogen incorporated into the film decreases further as the substrate temperature exceeds 300° C., hydrogen removal is less likely to occur during solid phase recrystallization at temperature in the range of 550° C. to 650° C. Therefore, in some cases it becomes important to perform this thermal treatment at temperature above this particular temperature range. A description concerning such a particular case and the method of treatment appears later in connection with FIG. 2D.

In summary, an amorphous silicon film formed by Plasma CVD contains about 10 atomic % hydrogen in the form of Si—H, H—Si—H and the like. When solid phase recrystallization is directly performed on an amorphous silicon film containing hydrogen, hydrogen atoms are rapidly released from the film, causing film damage and film release from a substrate. Therefore, the amorphous silicon film should be annealed at about 450° C., for example, prior to solid phase recrystallization in order to remove hydrogen from the film and increase the film density. Further, the preferred substrate' temperature in the FIG. 1 embodiment is in the range of about 150° C. to 300° C. because large grain sizes of 1 $\mu$m to 2 $\mu$m or greater are achieved and film release from the substrate and damage is less likely to occur compared to films deposited with a substrate temperature in the range of about room temperature to 150° C.

Figure 2A:
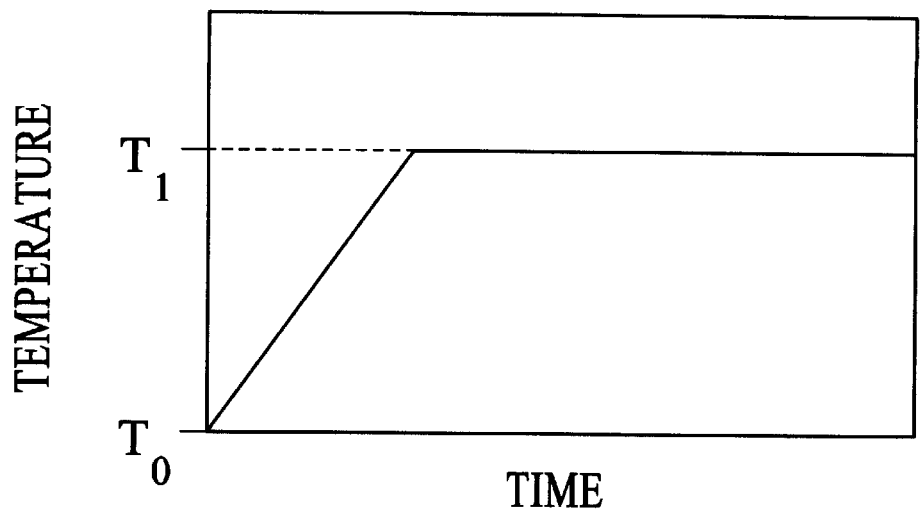
FIGS. 2A–2D are graphic illustrations of the temperature rise over time relative to one embodiment of this invention.

Attention is now turned to the particular thermal treatment process of this invention employing a gradual increasing temperature to a prescribed temperature for achieving solid phase recrystallization. FIGS. 2 are graphic illustrations of examples of several embodiments of this treatment process. As shown in FIG. 2A, the treatment temperature is gradually increased from room temperature, $T_0$, to a prescribed annealing temperature, $T_1$, uniformly at a predetermined temperature rise rate followed by annealing at the prescribed annealing temperature, $T_1$, for a predetermined period of time. As mentioned previously the preferred temperature rise rate is below 20° C./min, preferably at about 5° C./min, so that the occurrence of defects, associated with hydrogen dissipation, is suppressed. Although the rate of temperature rise is shown in FIG. 2A to comprise a uniform, ascending slop, this is not an absolute requirement, as the rate can be varied monotonically over time as an ascending nonuniform slop or curve within the temperature range between T=0 and $T_1$.

Figure 2B:
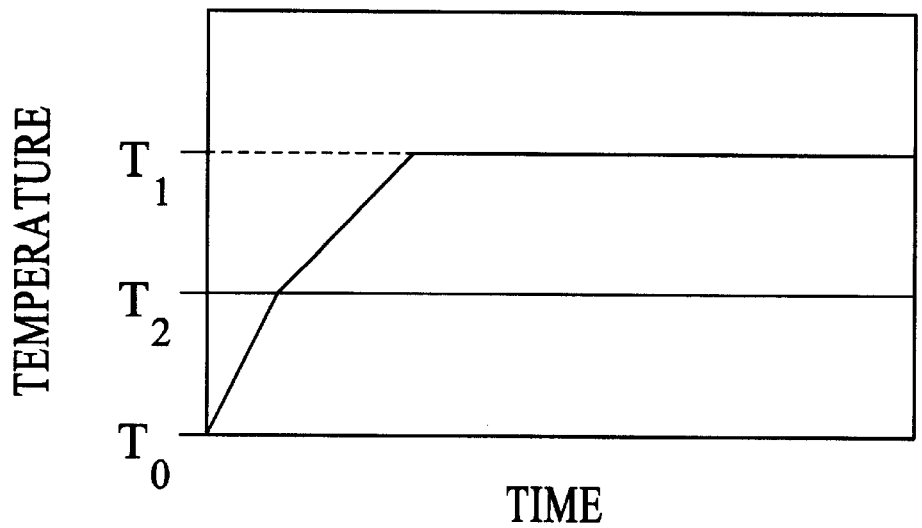

Also, the temperature rise rate can be gradually increased to $T_1$ at two or more consecutively different temperature rates. FIG. 2B graphically illustrates such a case wherein, first, the temperature is gradually increased to a first predetermined temperature, $T_2$, at a first predetermined temperature rise rate, then; secondly, the temperature is further increased to the prescribed annealing temperature, $T_1$, employing a slower, second predetermined temperature rise rate. The reason for the change of temperature rise rate around the temperature, $T_2$, is because, as indicated previously, removal of hydrogen from the film commences at higher temperature above around 300° C. Therefore, after hydrogen removal has begun, e.g., at about $T_2$=300° C., the temperature rise rate is reduced to a rate less than 20° C./min., preferably at about 5° C./min, in order to suppress the occurrence of defects in the film. Also, this two step temperature rise rate contributes to a shorten period of temperature rise. The preferred temperature range for $T_2$ is about 250° C. to 400° C. Also, as in the case of FIG. 2A, the temperature rise rate need not be uniformly the same, i.e., the rate can be varied with an ascending nonuniform slop within the temperature range between T=$T_0$ and $T_1$, as well as between $T_1$ and $T_2$, e.g., a monotonically decreasing temperature rate per unit time between T=$T_0$ and $T_1$. Further, when the temperature rise rate is changed at about $T_2$, the rate of change can be gradual to a higher temperature rise rate between $T_1$ and $T_2$.

Figure 2C:
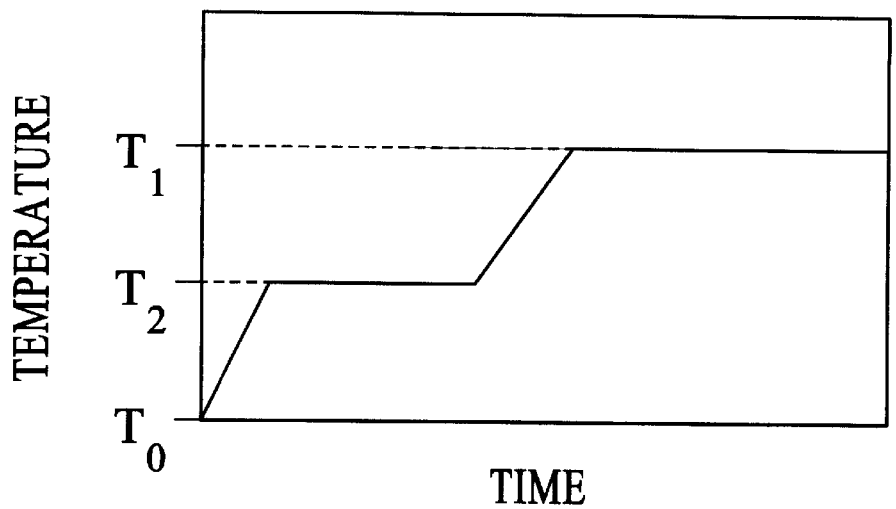

Also, it is within the scope of this invention that there be one or more $T_2$ levels of predetermined periods of time between a series of sequential steps of a given temperature rise rate or different temperature rise rates. FIG. 2C shows such a case wherein, first, the temperature is increased to a temperature $T_2$ at a given temperature rise rate and then, the temperature, $T_2$, is maintained for a given period of time. Then, the temperature is further increased at the same or another temperature rise rate to the prescribed annealing temperature of $T_1$. Large amounts of hydrogen present in the film can be removed without generating polycrystalline seeds in the film by initially maintaining a temperature below the prescribed annealing temperature for a predetermined period of time, for example, such as for about 20 minutes to 2 hours. Thus, even in the case where the temperature is increased rapidly to the prescribed annealing temperature for solid phase recrystallization after maintaining $T_2$ for a predetermined period of time, the occurrence of defects, associated with hydrogen removal process from the film, is less likely to occur. The desirable degree of $T_2$ in the case of FIG. 2C is in the range of about 350° C. to 550° C. As indicated previously, the rate of increase of the temperature from $T_2$ need not be at a uniform ascent. For example, it is acceptable to slowly increase the temperature by a value below 5° C./min, for example, 2° C./min, and gradually increase in value to a rate of 5° C./min. Further, there may be a series of $T_2$ temperature plateaus rather than one plateau as illustrated in FIG. 2C. For example, there may be several $T_2$ points between T=$T_0$ and $T_1$ wherein the temperature at each point is maintained for a predetermined period of time.

Figure 2D:
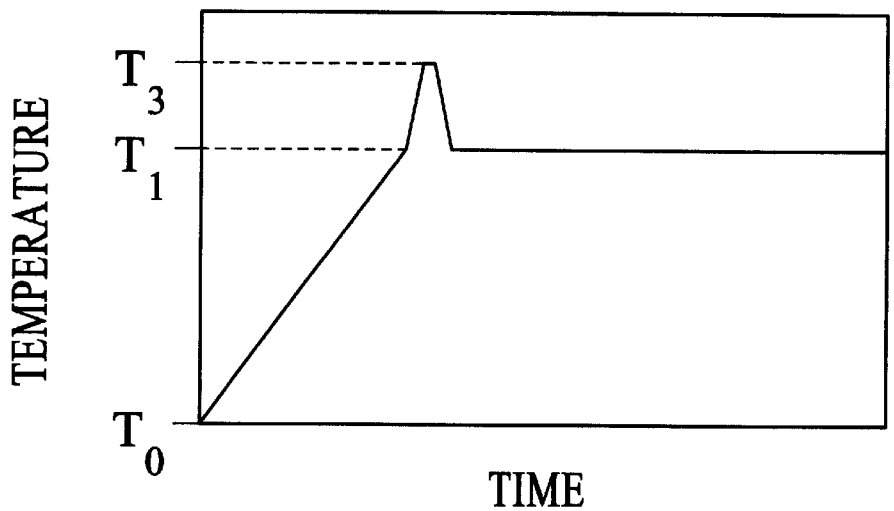

Also, the processing temperature may be increased immediately above the prescribed annealing temperature for a very short duration, followed by a return to a prescribed annealing temperature, such as around 550° C. to 650° C. By doing so, hydrogen present in the film can be more completely removed while concurrently suppressing the occurrence of defects in the film. FIG. 2D shows such a case wherein, first, the temperature is raised to the prescribed annealing temperature of $T_1$. Then the temperature is raised in a very short period time, such as in several minutes, to a higher temperature, $T_3$, above the prescribed annealing temperature, after which the temperature is reduced back to $T_1$ in a very short period of time, again, in a matter of several minutes. Thereafter, the prescribed annealing is performed at $T_1$. By including the initial step of raising the temperature to $T_3$ for a short period of time, crystalline growth can proceed with substantially complete removal of hydrogen, compared to the case wherein crystalline growth is hindered by the presence of hydrogen in the film at the time of annealing in the range of about 550° C. to 650° C. The preferred temperature of $T_3$ is in the range of about 700° C. to 800° C. It is necessary to maintain the time period for temperature increase to $T_3$ and for temperature decrease from $T_3$ to $T_1$ short, preferably within the range of about 1 to 10 minutes, in order to suppress the initial formation of polycrystalline seeds in the film. In this situation, lamp annealing is an effective means to raise the temperature to $T_3$ for a short period of time.

It is also possible to suppress occurrence of defects even further by a combination of the thermal treatment methods discussed relative to FIGS. 2A to 2D. Further, FIGS. 2A to 2D are just representative examples of thermal treatment embodiments for solid phase recrystallization methods of this invention and, therefore, this invention is not limited to the examples of these particular embodiments. The important point is the realization of a manufacturing method, previously considered in the art difficult to achieve, for the formation of a polycrystalline silicon film with large size grains and produced from an initially formed noncrystalline or amorphous silicon film, such as by solid phase recrystallization, employing the thermal treatment steps exemplified above relative to FIGS. 2. Although amorphous silicon films can be produced in large quantities by plasma CVD with application to large area substrates, the hydrogen content in such films is high. Since the hydrogen is known to hinder the employment of solid phase recrystallization, it was thought by those skilled in the art not to be a desirable method for forming amorphous silicon films on which solid phase recrystallization is to be subsequently performed.

Returning now to FIGS. 1, FIG. 1C is employed to illustrate a process for forming a gate insulator film 104 on a polysilicon film 103, which has been formed via solid phase recrystallization as previously explained. Film 104 is formed by oxidizing polycrystalline silicon layer 103 via thermal oxidation. The gate oxidation temperature employed is approximately 1,000° C. to 1,200° C. However, the crystallized volume fraction of polycrystalline silicon layer 103 is not necessarily very high. This is especially true when silicon film 103 is formed by plasma CVD followed by solid phase recrystallization and wherein initially formed film 102 is amorphous silicon or microcrystalline silicon or contains micro-crystal regions in the amorphous phase. The crystallized volume fraction in such a case may be in the range of approximately 40% to 85%. The resulting fraction varies within this range depending upon the conditions of film growth as well as solid phase recrystallization. Our studies confirmed, however, that in the case of oxidizing the polycrystalline silicon layer by thermal oxidation, if the temperature is rapidly increased to a high temperature of 1,000° C. to 1,200° C. in short period of time, crystallinity of remaining amorphous regions of the film, which is about 15% to 60%, will be damaged. Presently, the relation of the cause and effect here is not clear, however, some assumptions may be considered as follows:

When the temperature is rapidly increased for the purposes of thermal oxidation, (1) many crystal seeds are generated in the amorphous regions present in the film thereby forming many micro-crystal grains, (2) crystallization does not significantly proceed in the amorphous regions during the process of temperature rise and period of thermal oxidation, and/or (3) the remaining hydrogen in the film suddenly and rapidly dissipates from the film during temperature rise resulting in the formation film defects. In any case, in order to resolve this problem, we have discovered an approach to substantially improve the crystallinity of the polycrystalline silicon films by controlling the temperature rise rate and the method of increasing the temperature to the thermal oxidation temperature in the range of 1,000° C. to 1,200° C. In this connection, we have also discovered that there is a important relationship between the substrate temperature of a noncrystalline silicon film 102 during film formation, such as by plasma CVD, and the temperature rise method employed at the time of subsequent gate oxidation formation. First, the higher the substrate temperature during film formation, the smaller the amount of hydrogen content contained in the film. When the substrate temperature is over 350° C., preferably over 400° C., hydrogen content in the film dramatically decreases. Thus, the occurrence of defects associated with hydrogen removal during the temperature rise to the solid phase recrystallization temperature of 550° C. to 650° C. decreases. However, since the temperature at which substantially complete hydrogen removal from the silicon film is accomplished occurs at a higher temperature compared to the case where the film is formed at a low temperature, it is very important to optimize the temperature rise rate and the procedure employed for temperature rise when the temperature is to be increased to the gate oxidation temperature in the range of 1,000° C. to 1,200° C. Also, in the case where solid phase recrystallization is performed on a film which was formed at the substrate temperature at or above about 550° C., polycrystalline silicon or micro-crystalline silicon can be obtain with a <110> orientation, which is effective in lowering the TFT Si/SiO$_2$ interface state density and improving field effect mobility.

Secondly, since a large amount of hydrogen is contained in a film formed at a substrate temperature at or below about 350° C., it is important to remove the hydrogen from the film in order to avoid the occurrence of a large amount of defects in the film before proceeding to solid phase recrystallization in the temperature range of about 550° C. to 650° C. When hydrogen removal is performed under preferred conditions, there is a tendency that the polycrystalline silicon grains will become larger as the film growth temperature becomes lower. On the other hand, lower growth temperatures result in lower crystallized volume fraction after solid phase recrystallization. Thus, it is important to optimize the temperature rise rate and the procedure employed for temperature rise after solid phase recrystallization.

From all the foregoing, it is evident that, based upon the method of this invention, performing thermal treatment after solid phase recrystallization in a temperature range of about 550° C. to 650° C., is also effective for a thin film formed by other film growth methods, beside plasma CVD. Particularly, the method of this invention is very effective for a film characterized with low polycrystalline seed generation density at the time of solid phase recrystallization, i.e., a polycrystalline silicon with large crystal grains can be easily obtained by solid phase recrystallization. For example, there is also a very important relationship between the growth temperature of a silicon film formed by LPCVD and the method employed for temperature rise at the time of subsequent gate oxidation formation. When comparing a silicon layer formed at a high temperature, for example, in the range of about 580° C. to 610° C., to a silicon layer formed at a low temperature, for example, in the range of about 500° C. to 550° C., if the temperature rise to the gate oxidation temperature is increased rapidly, the crystallized volume fraction of a silicon film formed in the low temperature range will be lower and the resultant TFT field effect mobility will be smaller. However, when the method of temperature rise of this invention is employed, inversely, a silicon film formed in this low temperature with LPCVD will result in larger grains, achieved higher crystallized volume fraction and higher field effect mobility. It is believed that the reasons are that, first, a film formed at a low temperature in the range of 500° C. to 550° C. by LPCVD is amorphous silicon or micro-crystalline silicon containing micro-crystalline regions in amorphous phase. Therefore, compared to a film formed in the higher temperature range, polycrystalline seed generation density at the time of solid phase recrystallization is lower. Therefore, polycrystalline silicon with large grains can be obtained by the process of solid phase recrystallization.

Secondly, the crystalline quality of the film is damaged in a film formed in the low temperature range because the temperature is rapidly increased at the time of gate oxidation and also because of the large amorphous phase ratio after the solid phase recrystallization.

Therefore, this invention is effective in the case wherein amorphous silicon or micro-crystalline silicon is formed by vapor deposition, EB vapor deposition, MBE, sputtering, ECR-PCVD or the like. After micro-crystalline silicon, polycrystalline silicon, or the like is formed, such as by plasma CVD, CVD, ECR-PCVD, vapor deposition, EB vapor deposition, MBE, sputtering or the like, then ion implant of Si, Ar, or the like is performed to amorphize the partially amorphous silicon or partially amorphous silicon from a micro-crystalline silicon or polycrystalline silicon formed film, as the case may be. In particular, this invention is effective for a silicon film whose amorphous phase ratio for an as-deposited film is high and whose polycrystalline seed generation density is low, so that polycrystalline silicon with large grains can easily be obtained by employing solid phase recrystallization.

Figure 1C:
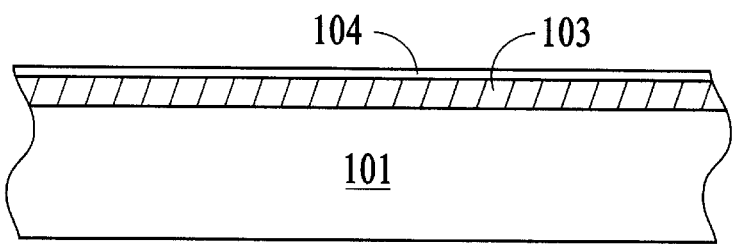
Figure 3A:
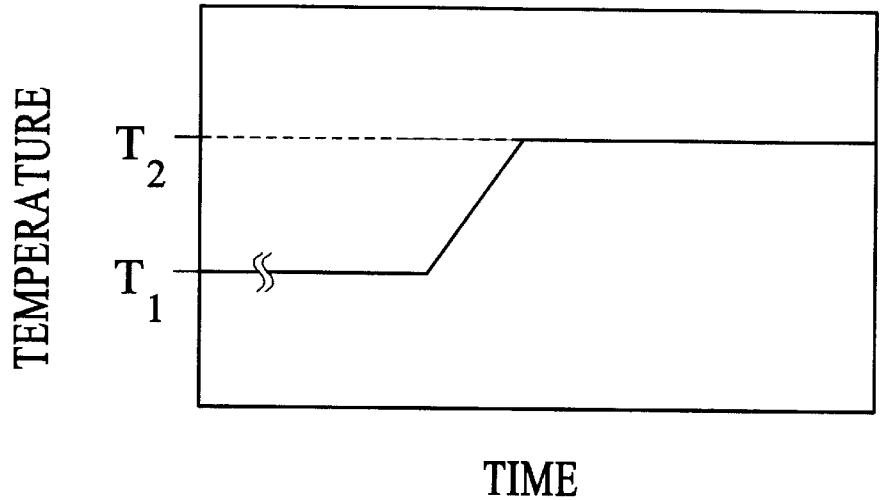
FIGS. 3A–3E are graphic illustrations of the temperature rise over time relative to another embodiment of this invention.

Reference is now made of the method of this invention pertaining to temperature rise to a prescribed gate oxide temperature to form gate oxide film 104 illustrated in FIG. 1C. FIGS. 3 are graphic illustrations of examples of temperature rise according to several different embodiments of the method of this invention to achieve gate oxide film 104. FIG. 3A indicates, as was previously described in connection with FIGS. 2 as an annealing treatment, which is conducted in an inert gas atmosphere, such as argon, nitrogen or the like, at a prescribed temperature, $T_1$, to perform solid phase recrystallization on noncrystalline silicon film 102 to form polycrystalline silicon film 103. Then, gate oxidation is performed after temperature is raised at a specified temperature rise rate to the prescribed gaff oxide temperature, $T_2$. It is preferable that the temperature rise rate from $T_1$ to $T_2$ be below about 20° C./min, preferably at about 5° C./min, because the crystallized volume fraction will be of high value after the completion of gate oxidation. Also, while the temperature is being increased to $T_2$, the atmosphere may also be changed from inert gas atmosphere, such as argon, nitrogen or the like, to an atmosphere containing at least one or more gas mediums from the group of oxygen, water vapor, hydrogen chloride or the like, to promote oxidation process. Further, the temperature rise rate need not be constantly the same, but it may be varied within the temperature range between $T_1$ and $T_2$.

Also, the sample may be removed from the reactor after thermal treatment for solid phase recrystallization is performed at the temperature, $T_1$, and placed in an oxidation treatment apparatus wherein the temperature is increased to $T_2$ at a specified temperature rise rate. For example, after solid phase recrystallization, a sample is removed from the reaction chamber and then placed into an oxidation chamber which is maintained at prescribed temperature of 600° C. to 900° C., preferably 600° C. to 750° C. Then, the temperature is increased by a rate below 20° C./min, preferably at about 5° C./min, to gate oxide temperature, $T_2$. However, when thermal treatment is performed continuously in the same chamber without removal of the sample and without breaking vacuum, crystalline quality was better because less impurity was introduced to the processed film.

Figure 3B:
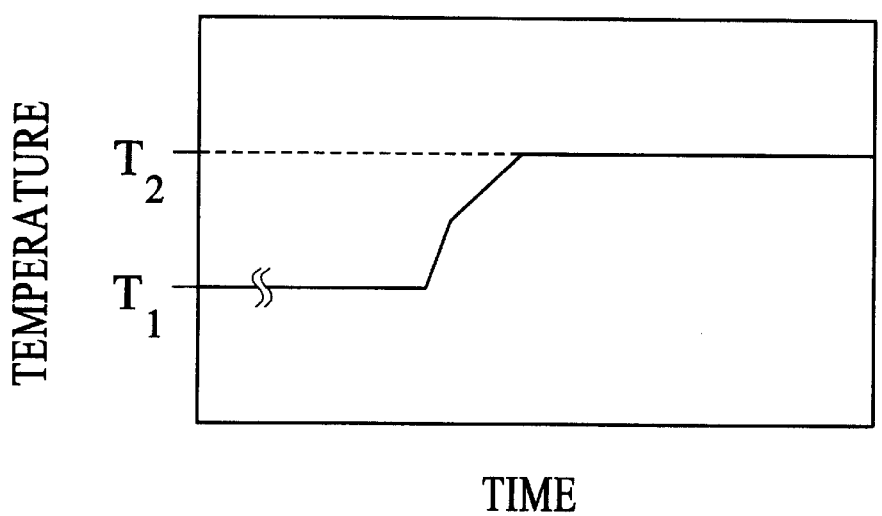

FIG. 3B shows the case wherein annealing is performed on silicon film 102 for purposes of solid phase recrystallization at the prescribed annealing temperature, $T_1$, in order to form polycrystalline silicon layer 103, as exemplified in FIG. 2. Then, the temperature is increased to the gate oxide temperature, $T_2$, at a decreasing gradient rate as the overall temperature is increased to $T_2$ to perform gate oxidation. In particular, when the temperature exceeds the range of about 800° C. to 1,000° C., the temperature rise rate is reduced to below 5° C./min. On the other hand, when the temperature is below about 700° C., the temperature rise rate may be in excess of 10° C./min.

Figure 3C:
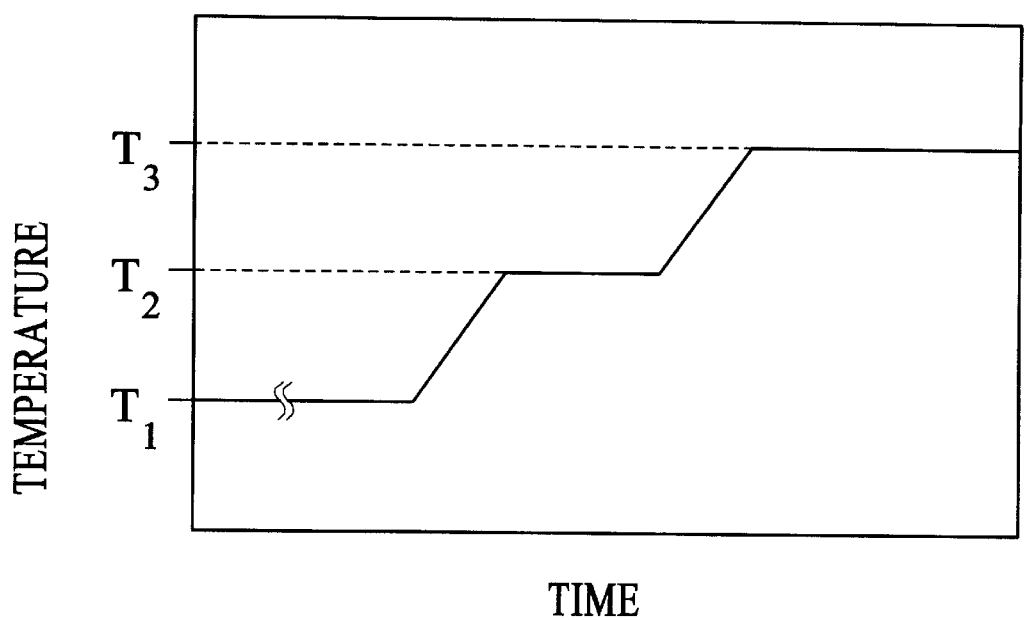

FIG. 3C shows the case wherein solid phase recrystallization is performed at the prescribed annealing temperature, $T_1$, on silicon layer 102 to form polycrystalline silicon layer 103, as exemplified in FIG. 2. Then, the temperature is increased to a prescribed intermediate temperature, $T_2$, at a predetermined temperature rise rate. After it is maintained for a predetermine time at $T_2$, the temperature is further increased to a prescribed gate oxide temperature, $T_3$, at a predetermined temperature rise rate, which may be at the same rate as the previous rate or at a different temperature rise rate. By maintaining the lower temperature, $T_2$, for a period of time, such as 10 minutes to 1 hour at a temperature in the range of about 700° C. to 900° C., and thereafter increasing the temperature to the gate oxide temperature, $T_3$, in the range of 1,000° C. to 1,200° C., the crystallized volume fraction can be increased without damaging the crystalline quality of the film. Therefore, in the case where the temperature is increased to the gate oxidation temperature at a fairly rapid temperature rise rate after the temperature is maintained a predetermined period of time at an intermediate temperature, $T_2$, defects are less like to occur in the film. Alternatively, an intermediate temperature, $T_2$, need not remain at the same value, i.e., maintained at a plateau. For example, the temperature can be raised at a rate below 5° C./min during the period of this intermediate level. Also, there can be a series of temperature plateaus of short periods, e.g., 10 minutes to 1 hour, between the temperatures $T_1$ and $T_3$. For example, after the temperature is increased from $T_1$ at a rate of 5° C./min, the temperature may be maintained at about $T_2$=700° C. for 20 minutes or the like and then again increased at the rate of 5° C./min to $T_2$=800° C. for 10 minutes or the like and then finally increased at the rate of 5° C./min to $T_3$=1000° C. This gradient approach from $T_1$ to $T_3$ is effective in the reduction of defects in the oxidation of film 103.

Figure 3D:
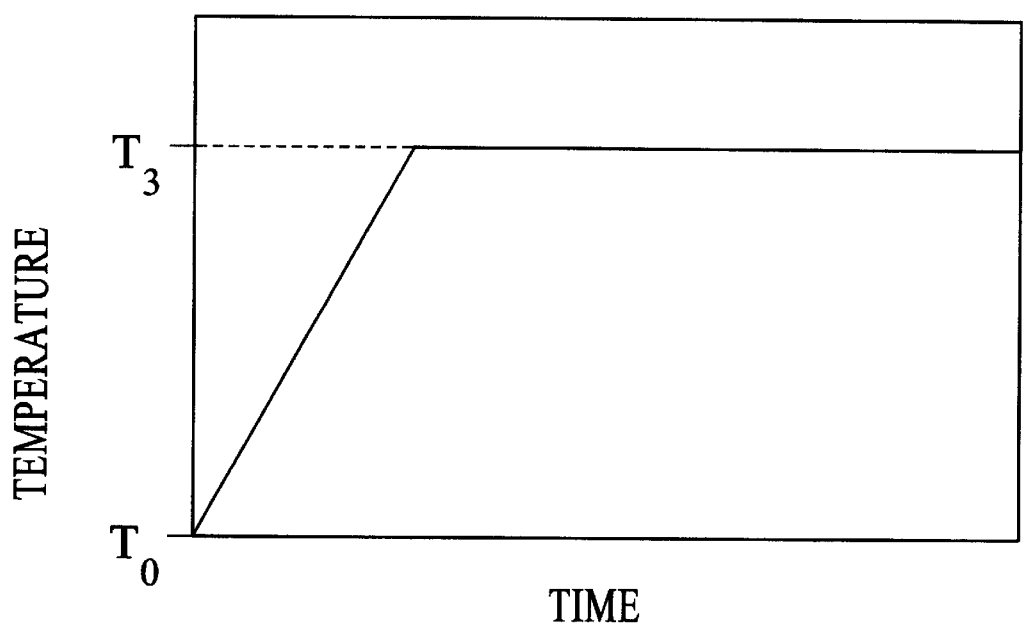

FIG. 3D illustrates the case wherein the gate oxidation is performed after the temperature is increased to gate oxidation temperature, $T_3$, at a predetermined temperature rise rate. This approach provides for a shorten processing time because there is no requirement for a special thermal treatment stage at a prescribed annealing temperature for solid phase recrystallization, i.e., the temperature is not maintained at a prescribed solid phase recrystallization temperature level because solid phase recrystallization occurs during the period of temperature rise to the higher prescribed gate oxidation temperature, $T_3$. This is because a slow temperature rise rate is employed in order to achieve high crystallized volume fraction so that solid phase recrystallization progresses during the course of the slowly increasing temperature is complete before the gate oxidation temperature, $T_3$, is attained. In this particular case, the preferred temperature rise rate may be equal to or below about 10° C./min, preferably below 2° C./min. The temperature rise rate need not be fixed, but it may be varied within the foregoing range. For example, the temperature rise rate may begin at 20° C./min to a temperature of 600° C., continue at 4° C./min to a temperature of 800° C. and thereafter 6° C./min to a temperature, for example, of $T_3$=1000° C.

Figure 3E:
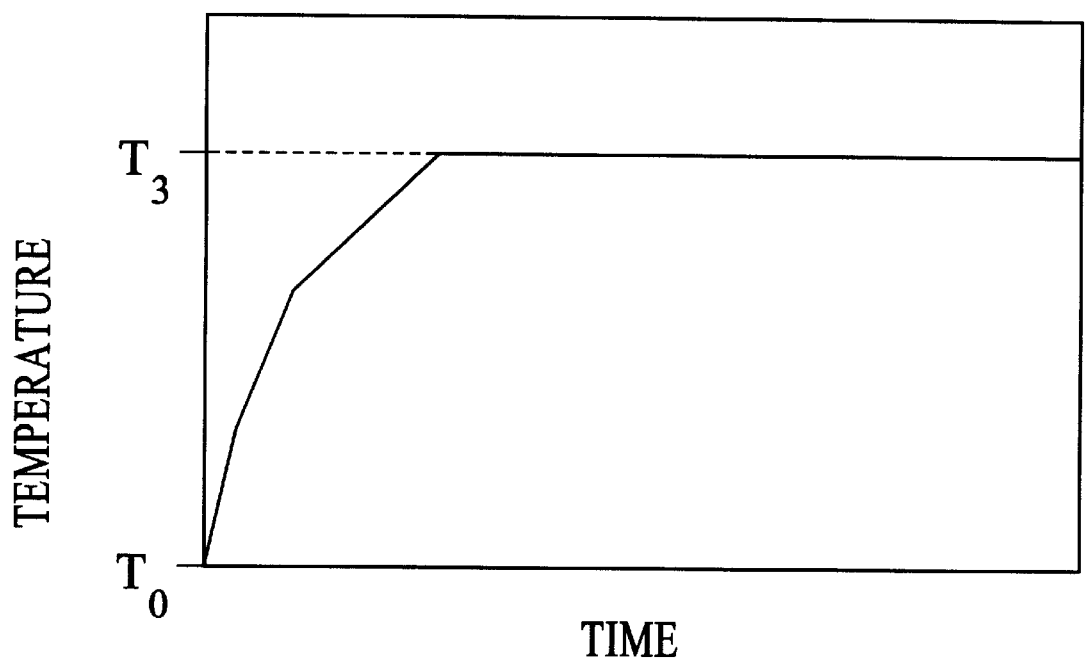

FIG. 3E illustrates the case wherein gate oxidation is performed after the temperature is increased to gate oxidation temperature, $T_3$, at periodically reduced rates as the processing temperature increases. In particular, when the temperature exceeds the range of about 700° C. to 1,000° C., the preferred temperature rise rate is below 5° C./min, preferably at about 2° C./min, because an improved crystalline quality is achieved in the polycrystalline silicon film 103. On the other hand, when the temperature is below about 250° C., even if the temperature rise rate is above about 40° C./min, there is negligible effect on the crystalline quality of polycrystalline silicon film 103. Therefore, the gate oxidation processing time can be reduced by having an initial high rate provided during the initial period of temperature rise. Thus, the temperature rise rate at the beginning period in FIG. 3E may be about 40° C./min up to about 300° C. Since hydrogen removal is accomplished in the temperature range of about 300° C. to 500° C., the preferred temperature rise rate is equal to or below 10° C./min, preferably below 4° C./min. Since solid phase recrystallization is accomplished in the range of about 500° C. to 700° C., the preferred temperature rise rate is below 5° C./min, preferably, about 2° C./min. This rise rate may, then, be maintained until the oxidation temperature, for example, $T_3$=1000° C., is attained. Thus, in the example of FIG. 3E, there are three separate periods of different, descending temperature rise rates.

Moreover, it is possible to suppress the occurrence of defects by combining one or more of the treatments exemplified in FIGS. 3A to 3E to achieve improved crystalline quality and increase the crystallized volume fraction. FIGS. 3, therefore, are just examples of embodiments of this invention and the treatment for gate oxidation is not limited to just those particular examples.

In connection with the forgoing embodiment, it should be noted that this invention is not limited to the high temperature thermal treatment process for providing the gate oxide film 104. For example, it is sufficient to perform a single step thermal treatment at a predetermined temperature, for example, in the temperature range of about 700° C. to 1,200° C., after increasing the temperature at a specified temperature rise rate to the predetermined treatment temperature. Further, the formation of the gate insulation film is not limited to a thermal oxidation treatment, but may also be deposited as a layer, for example, by CVD, sputtering, plasma CVD, ECR-PCVD or the like. However, in the case where gate insulator film 104 in an insulated gate type semiconductor element is formed by employing thermal oxidation, the performance of the thermal treatment of this invention for purposes of solid phase recrystallization continues as the thermal oxidation process thereby contributing to a reduction in the overall process time.

Figure 1D:
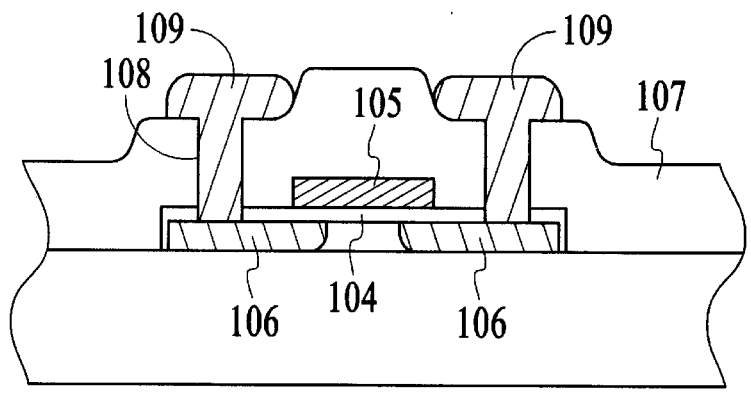

Returning now to FIGS. 1, FIG. 1D is employed to illustrate a process that may be used to complete the formation of a TFT semiconductor device proceeding from the structure shown in FIG. 1C, i.e., after the completion of the formation of gate oxide film 104. In FIG. 1D, the particular example is the formation of a TFT semiconductor element. After gate electrode 105 is formed on gate oxide film 104, a source/drain region 106 is formed via ion implantation, thermal diffusion, plasma doping or the like, as is conventional in the art. Then, interlevel insulator layer 107 is formed, for example, by CVD, sputtering, plasma CVD or the like, as is conventional in the art. This is followed by the formation of contact holes 108 in interlevel insulator layer 107 and, thereafter, interconnections 109, e.g., Al, are formed in a manner known in the art.

It should be noted that, by including in the method of this invention the exposure to a plasma atmosphere containing at least hydrogen gas or ammonia gas during the course of TFT manufacturing wherein the TFT is hydrogenated, then defect density existing at the grain boundary decreases and the field effect mobility will be improved. The resultant field effect mobility of an n channel, polycrystalline silicon TFT formed in accordance with the method of this invention is 150 cm$^2$/V·sec to 200 cm$^2$/V·sec. Thus, a high quality polycrystalline silicon TFT can be easily manufactured by the method of this invention. Further, the polycrystalline silicon film formed by this invention is not limited to insulating gate type field effect transistors in its application, but it is also applicable to bipolar transistors, static induction transistors, and opto-electric transducers such as solar cells and the like. This invention produces a high quality polycrystalline silicon film having carrier mobility in excess of 150 cm$^2$/V·sec.

In the formation of polycrystalline silicon TFTs via solid phase recrystallization, there is a tendency for the threshold voltage, $V_{th}$, in the case of a n channel transistor to shift toward the depletion side, and in the case of a p channel transistor, to shift toward enhancement direction. Also, when the formed TFT becomes hydrogenated, this tendency becomes more pronounced. However, if an impurity, for example, in the concentration range of about $10^{15}$/cm$^3$ to $10^{19}$/cm$^3$ is doped at the channel region after solid phase recrystallization, this shift in $V_{th}$ can be suppressed. Therefore, the incorporation of impurities in channel region is quite effective to control threshold voltage, $V_{th}$. For example, in the case of the TFT in FIG. 1D, an impurity, such as boron, is formed in film 103 before the formation of gate electrode 105 employing ion implantation and the impurity dose applied is in the range of approximately $10^{11}$/cm$^2$ to $10^{13}$/cm$^2$. In particular, when the doping is performed within the above mentioned concentration range, $V_{th}$ can be effectively controlled to minimize OFF current in both n channel transistors and p channel transistors. Therefore, in the formation of CMOS type TFT elements, the entire TFT channel can be doped in a single process without the need to selectively dope a p-type channel or a n-type channel.

Figure 4A:
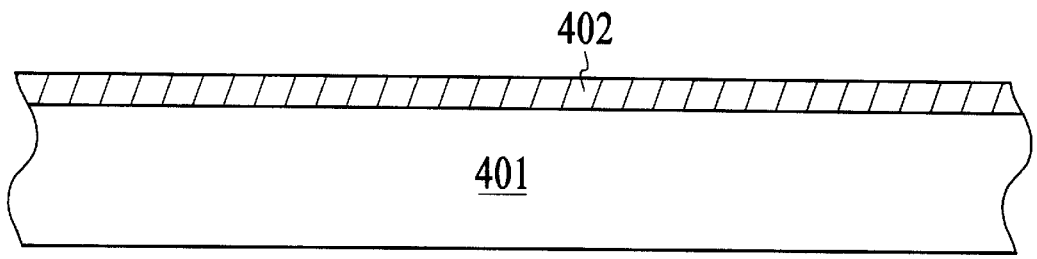
FIGS. 4A–4H illustrate a series of manufacturing steps in the manufacture of a semiconductor device in carrying out another embodiment of the method comprising this invention.

Alternatively, another effective method of doping may be employed to achieve similar results and involves doping during film growth of film 102 prior to solid phase recrystallization. The dopant impurities are electrically activated after heat treatment which decreases the resistivity of the film. This method of doping is described in connection with FIGS. 4. FIG. 4A illustrates a process of forming boron doped, amorphous silicon film 402 on insulating support 401, such as an insulating substrate, such as glass, quartz or the like; or an amorphous layer, such as SiO$_2$, Si$_3$N$_4$ or the like. In order to form boron doped amorphous silicon films 402, deposition is performed by dissociating silane gas (SiH$_4$) diluted with helium gas (He) or hydrogen gas (H$_2$). Also, diborane gas (B$_2$H$_6$) is added to this gas medium and rf power is applied to promote gas dissociation. By controlling the boron doping amount within the range of approximately $1\times10^{15}$/cm$^3$ to $1\times10^{19}$/cm$^3$ by changing the mixture or flux ratio of silane gas and diborane gas, $V_{th}$ can be controlled to minimize OFF current. The flux ratio of diborane to silane is preferably in the range of $10^{-7}$ to $10^{-3}$.

Figure 4B:
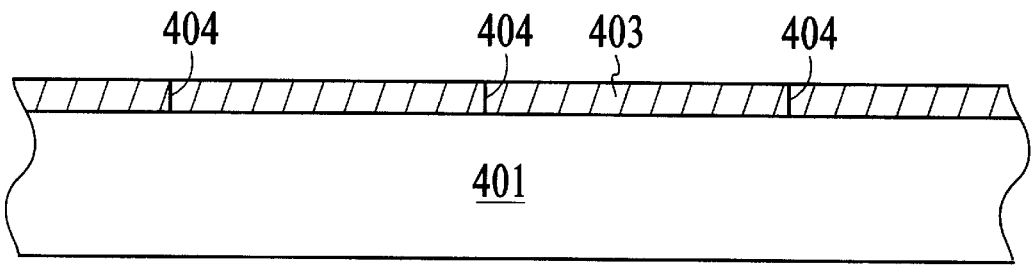

Next, solid phase recrystallization is performed on boron doped, amorphous silicon film 402. This is illustrated in connection with FIG. 4B The method of solid phase recrystallization employed is the same as that employed relative to the embodiment of FIG. 1B. In FIG. 4B, solid phase recrystallization results in boron doped, silicon film 403 with grain boundaries indicated at 404. Amorphous silicon films 402 containing doping impurities, such as boron or the like, are more easily recrystallized compared to undoped silicon films and, further, they contain crystal grains equal to or in excess of 2 $\mu$m in diameter. We have noted cases of grains equal to or in excess of 4 $\mu$m in diameter.

Figure 4C:
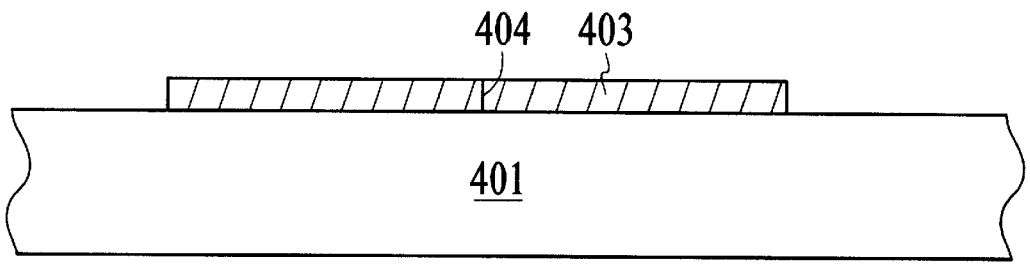
Figure 4D:
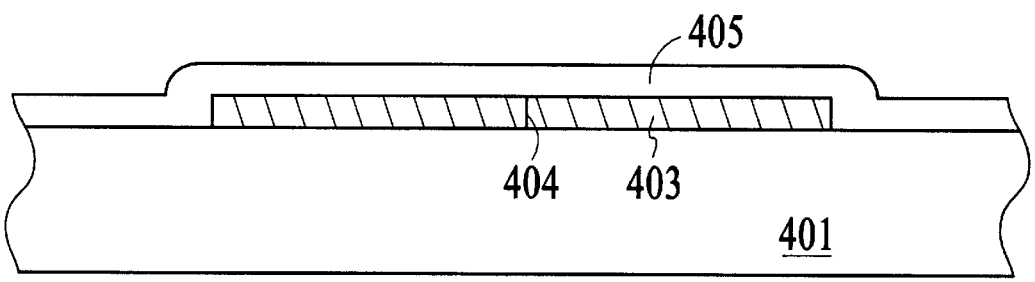

Next, boron doped, silicon layer 403 is patterned via conventional methods of photolithography to form an insular shape shown in FIG. 4C. Next, gate insulator film 405, as illustrated in FIG. 4D, is formed by thermal oxidation treatment or the like, as previously discussed.

Figure 4E:
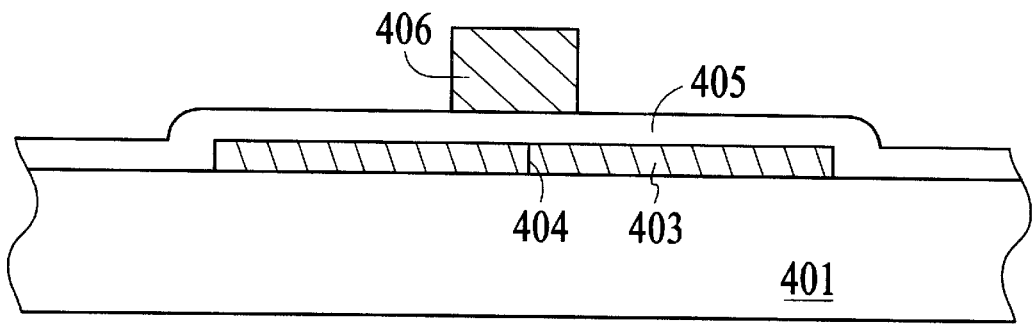

Next, gate electrode 406 is formed as shown in FIG. 4E employing a conventional method. The material of gate electrode 406 may be a thin film polycrystalline silicon, a molybdenum silicide film, a metal film, e.g., aluminum, chrome or the like, or a transparent conductive film, e.g., ITO, SnO$_2$ or the like. The gate electrode film may be deposited by CVD, sputtering, vacuum evaporation, etc.

Figure 4F:
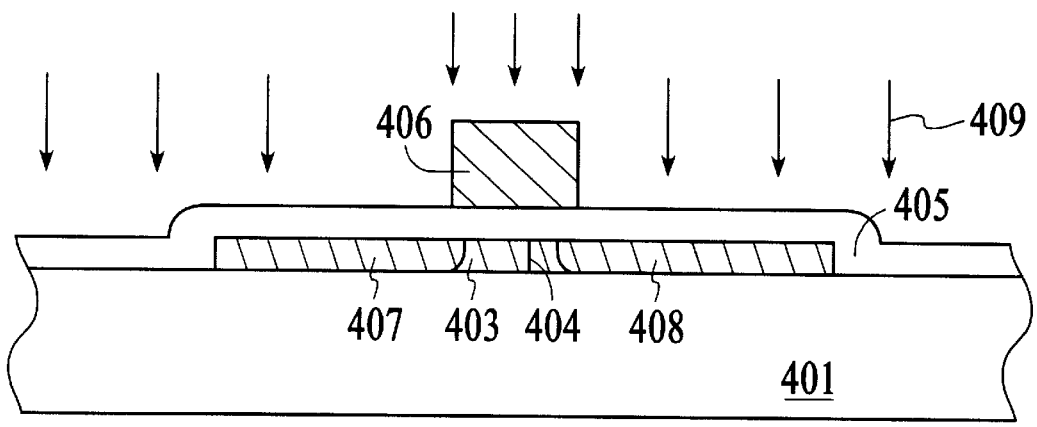

After the formation of gate electrode 406, source region 407 and drain region 408 are formed by self-alignment via ion implantation, as indicated by arrows 409 in FIG. 4F, employing gate electrode 406 as a mask. When fabricating a n channel transistor, P+ or As+ are employed as an impurity and when fabricating a p channel transistor, B+ or the like are employed as an impurity. Other alternative methods of adding these impurities that may be employed are laser doping or plasma doping. The thermal diffusion method of doping may be employed when a quartz substrate is employed as insulating support 401.

Figure 4G:
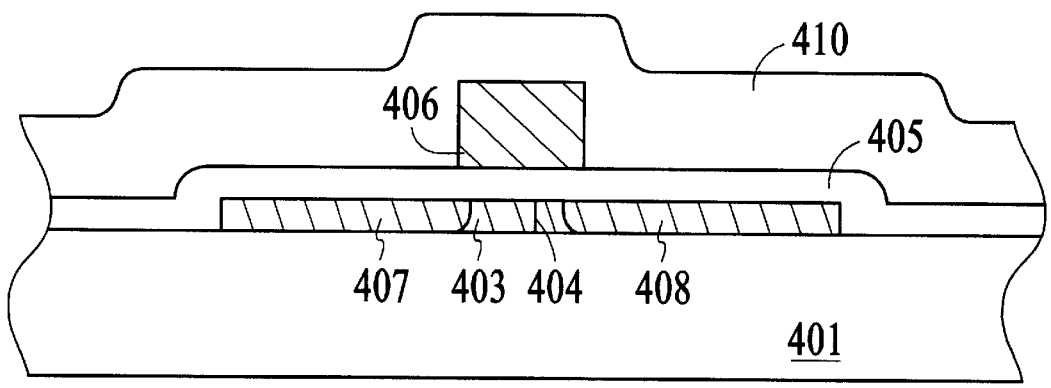

Next, interlevel insulator 410 is formed, as shown in FIG. 4G. An oxide film or a nitride film may be employed as the interlevel insulating material. The film thickness may be of any desired thickness as long as the insulation quality is good. However, the conventional thickness is in the range of approximately several thousand Å to several $\mu$m. The simplest methods for forming a nitride film are by LPCVD or PCVD employing a mixture of Ammonia gas (NH$_3$), silane gas, and nitrogen gas or a mixture of silane gas and nitrogen gas.

Also, a hydrogenation process may be performed before or after forming one or more interlevel insulator films 410. In the case where hydrogen is introduced by a hydrogen plasma method, or by hydrogen ion implantation or by a hydrogen diffusion method from a plasma formed nitride film, defects, such as dangling bonds, occurring around the Si/SiO$_2$ interface and grain boundary can be inactivated.

Figure 4H:
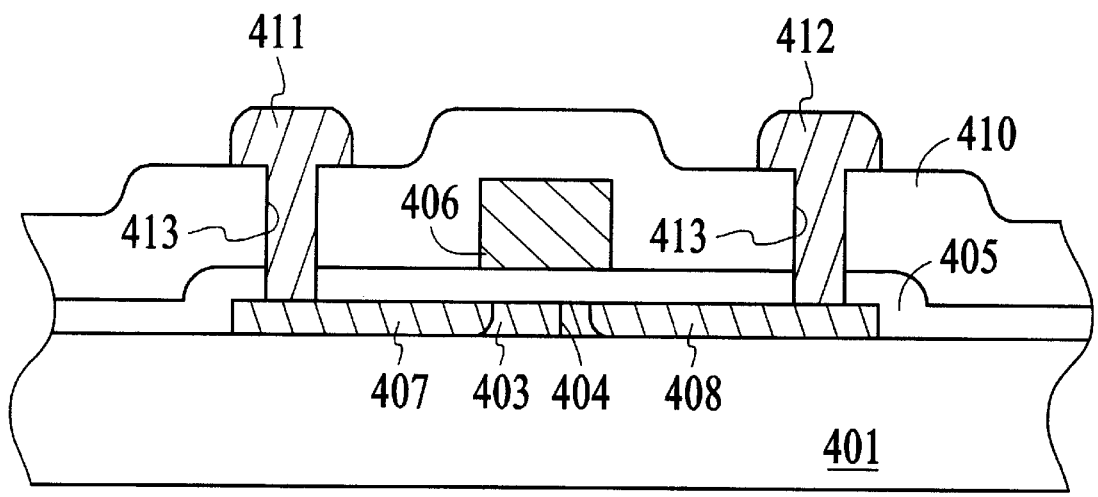

Next, as illustrated in FIG. 4H, contact holes 413 are formed in interlevel insulator film 410 and gate insulator film 405. Then, source electrode 411 and drain electrode 412 are formed in a conventional manner. Source electrode 411 and drain electrode 412 comprise a metallic material, such as aluminum or the like.

The following merits are realized by doping impurities during the film growth prior to solid phase recrystallization in order to control $V_{th}$, particularly as compared against doping impurities using ion implantation. First, there is no need for expensive equipment, such as ion implantation system, which is effective costwise. Also, there is no increase in the number of different processes to be employed, particularly since the doping process may be injected during or take place concurrently with film formation. Secondly, since a boron doped silicon thin film is formed by solid phase recrystallization, compared to the case where a nondoped silicon thin film is formed by solid phase recrystallization, a polysilicon thin film containing larger crystal grains can be realized. As a result, the larger the grain size becomes, the larger an increase in ON current of a TFT can be achieved.

Thus, as described above, a thin film transistor employing a polycrystalline silicon thin film having large grains may be accomplished in a simple process by forming a boron doped amorphous silicon thin film via solid phase recrystallization for the purposes of controlling the transistor threshold voltage. Also, the method of forming a doped polycrystalline silicon thin film with large grains by solid phase recrystallization which is doped during the film growth also has the advantage of producing materials for gate electrodes and circuit or element interconnections.

Reference is now made to the embodiment in FIG. 5 to explain the employment of the method of this invention relative to another embodiment. In this embodiment, amorphous silicon is employed for the purpose of illustrating an example of an initially formed amorphous gate electrode for a TFT semiconductor device. However, amorphous Ge, amorphous SiGe and the like are equally applicable to this example.

Figure 5A:
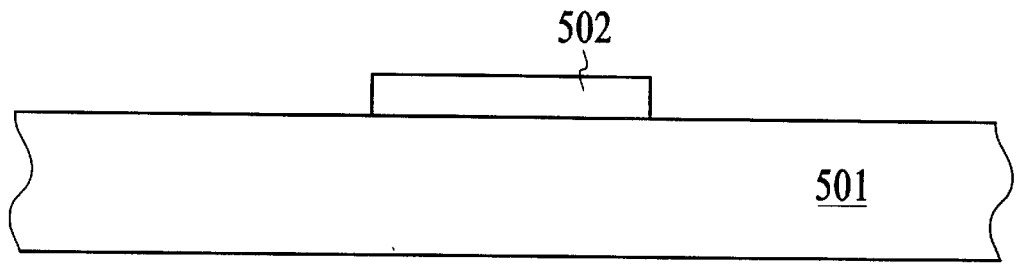
FIGS. 5A–5F illustrate a series of manufacturing steps in the manufacture of a semiconductor device in carrying out still another embodiment of the method comprising this invention.
Figure 5B:
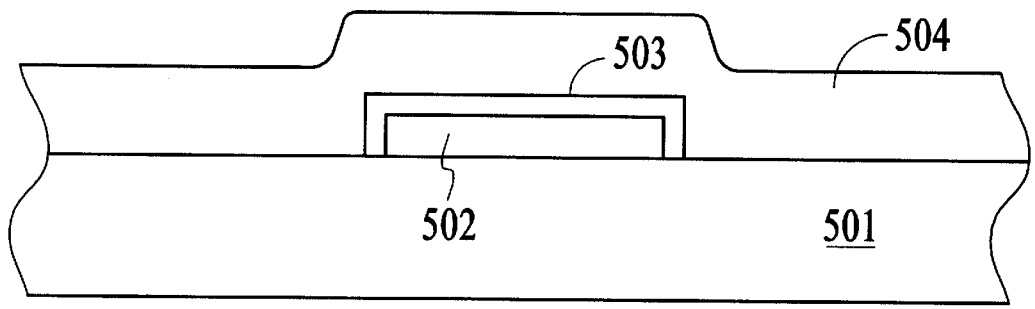
Figure 5C:
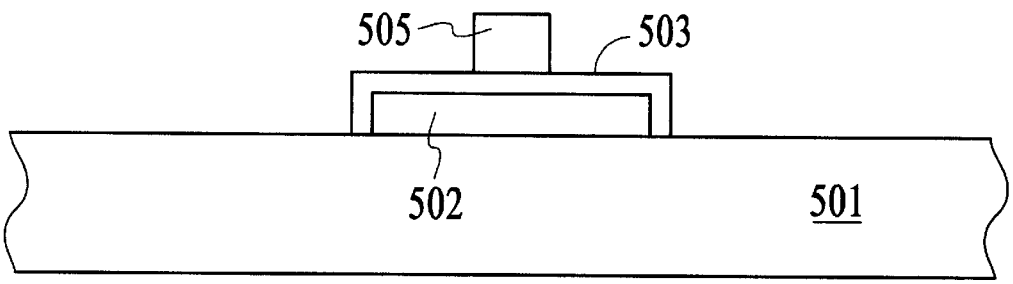

FIG. 5A shows a process wherein amorphous or polycrystalline silicon film 502 is formed on insulating support 501 having a thickness in the range of about 100 Å to 2,000 Å by plasma chemical vapor deposition (PCVD), low pressure chemical vapor deposition (LPCVD) or the like. Then, etching is performed on this silicon film 502 to form a predetermined pattern as illustrated in FIG. 5A. If required, solid phase recrystallization or laser annealing is performed on film 502 either before or after patterning to obtain larger grains. Next, as shown in FIG. 5B, insulating film 503, comprising a SiO$_2$ layer, is formed by thermal oxidation, sputtering or the like over silicon film 502 to a thickness in the range of about 300 Å to 1500 Å. This is followed by the formation of amorphous silicon film 504, for example, by PCVD, ECR-PCVD, sputtering, Si ion implantation on a polycrystalline silicon thin film or the like having a thickness in the range of about 3,000 Å to 7,000 Å. PCVD is employed as an example for the purpose of illustration of this embodiment. A SiH$_4$ and H$_2$ are employed as the film growth gas medium in PCVD and PH$_3$ gas or B$_2$H$_6$ gas is employed as the doping gas. In the case of PH$_3$, n+ polycrystalline silicon can be formed, and in the case of B$_2$H$_6$, p+ polycrystalline silicon can be formed. The substrate temperature employed was in the range of 180° C. to 250° C., the internal pressure was 0.8 Torr, and the rf power was 13.56 MHz. The flux ratio of PH$_3$ or B$_2$H$_6$ and SiH$_4$ was set so that the resultant P or B concentration would be in the range of 1×10$^{16}$ cm$^{-3}$ to 1×10$^{22}$ cm$^{-3}$.

After an amorphous silicon layer 504 is formed, this layer is patterned via photolithography to form gate electrode 505. Then, solid phase recrystallization is performed. Alternatively, solid phase recrystallization may also be performed before patterning of layer 504. However, in this alternative case, the structure is first pre-annealed at 450° C. for 30 minutes in an N$_2$ environment to remove hydrogen contained in amorphous silicon layer 504. The purpose of this step is to avoid producing a porous film because if solid phase recrystallization annealing is performed with amorphous silicon film 504 still containing hydrogen, then those portions where hydrogen is removed will become damaged rendering the material not useful for device fabrication.

Various other types of thermal treatment, other than the above treatment, may be performed before proceeding with solid phase recrystallization in accordance with the teachings relative to FIG. 2. The method of PCVD is desirable because it has the advantage wherein, if the gas for film growth is diluted with He gas, the amount of hydrogen which will be introduced into amorphous silicon film 504 can be reduced.

After the step of pre-annealing, solid phase recrystallization annealing is performed in a N$_2$ gas environment in a temperature range of about 550° C. to 650° C. for a period of several hours to 40 or more hours. The differences in this annealing time lie mainly in the ease in removing hydrogen from the film, i.e., the Amorphous silicon layer 504 is polycrystallized and the average grain size of microcrystalline silicon in gate electrode 505 is principally in the range of about 1 to 3 μm in diameter with the inclusion of many grain sizes of 5 μm in diameter or greater. Solid phase recrystallization may alternatively be carried out employing laser beam annealing or halogen lamp annealing. In the case where laser beam or halogen lamp annealing is employed, the annealing time can be shorter compared to the time for N$_2$ annealing. P or B impurity, which was introduced during the film growth of film 502, is concurrently activated during this annealing process. As a result, the resistivity of polycrystalline gate electrode 505 in both n$^+$ polycrystalline silicon and p$^+$ polycrystalline silicon is in the range of 1×10$^{-3}$ Ω·cm to 3×10$^{-3}$ Ω·cm. Thus the same level of resistivity can be obtained by this PCVD process compared to the case where conventional LPCVD is employed. The resistivity gate level for such a TFT device fabricated by LPCVD is around 2.5×10$^{-3}$ Ω·cm for an n-type doped polycrystalline silicon gate electrode. Furthermore, the average grain size of a conventional LPCVD n-type doped polycrystalline silicon gate electrode is about 3,000 Å or less which is a great deals less than the grain size of 1 μm or greater achieved by the method of this invention.

Figure 5D:
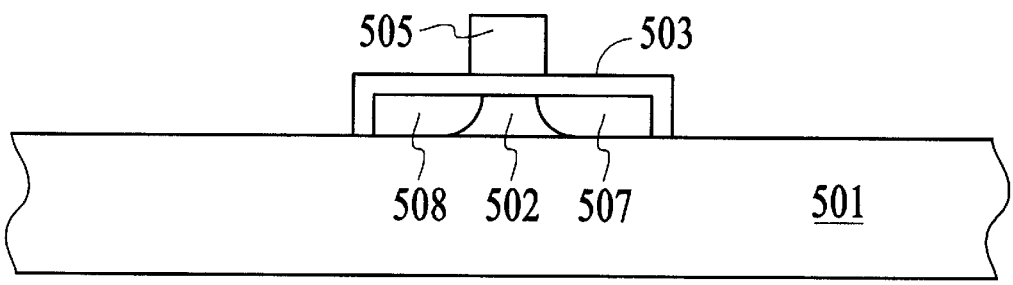

In FIG. 5D, source region 508 and drain region 507 are formed by P$^+$ ion implantation, in the case of a n channel TFT, and by B$^+$ ion implantation, in the case of p channel TFT, wherein gate electrode 505 functions as a mask. Next, an N$_2$ annealing treatment is performed at a temperature in the range of about 800° C. to 1,000° C. As a result of this annealing step, B or P impurity in gate electrode 505 is completely activated and, concurrently, an increase in crystallized volume fraction is also achieved. Also, the resistivity of a $n^+$ polycrystalline silicon gate electrode or and $p^+$ polycrystalline silicon gate electrode is reduced to approximately equal to or less than $1\times10^{-3}$ Ω·cm due to this annealing treatment.

ECR-PCVD is also suitable for forming amorphous silicon film 504 for the gate electrode 505. The hydrogen content in an amorphous silicon film 504 formed by ECR-PCVD is lower than that in the case of PCVD, so that, in this case, the pre-annealing process for hydrogen removal may be omitted. Also, amorphous silicon film 504 may be formed by the method of remote plasma CVD at substrate temperature of over 370° as is described in the article of G. N. Parsons et al. in the *Journal of Non-Crystalline Solids*, Vol. 107, pp. 295–300 (1989). By employing this method, hydrogen contained in an amorphous silicon film 504 can be substantially removed rendering it more suitable for the next step of solid phase recrystallization.

Figure 5E:
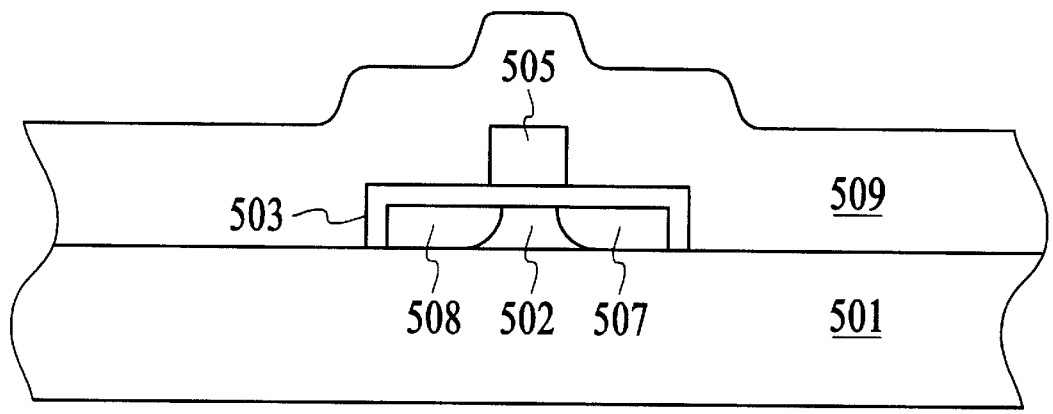
Figure 5F:
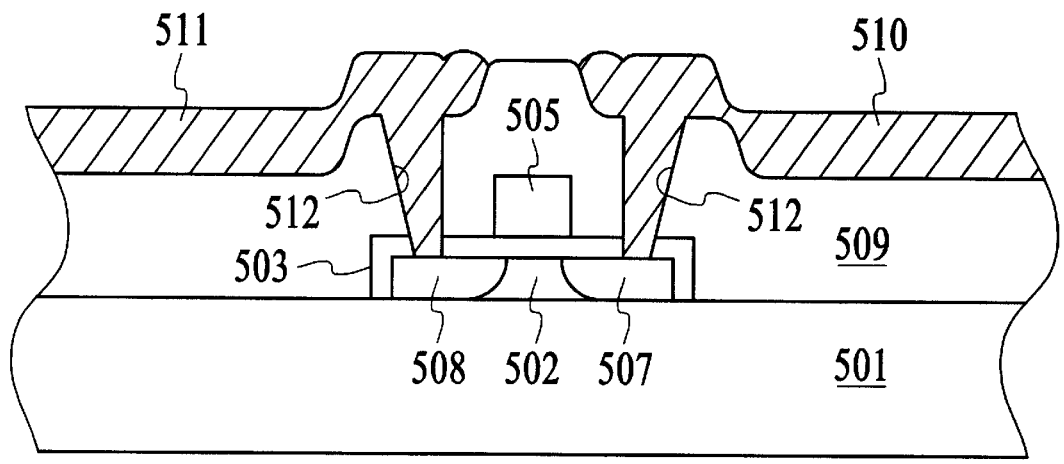

Next, as illustrated in FIG. 5E, interlevel insulator film 509 comprising $SiO_2$ is formed, for example, by CVD, PCVD, sputtering or the like. A $Si_3N_4$ film may also be employed as an interlevel insulator film. At this stage, a hydrogenation process, e.g., by the hydrogen plasma method, hydrogen ion implant, hydrogen diffusion method from a plasma nitride film or the like, may be performed on the structure if hydrogen has been introduced into film 502 during its formation in order to terminate dangling bonds existing at the $Si/SiO_2$ interface and grain boundary thereby decreasing the trap state density. Alternatively, this hydrogenation process can be performed before depositing interlevel insulator film 509.

Next, source and drain contact holes 512 are formed and metal contacts, e.g., Al, are deposited, such as by sputtering or the like, to a thickness of about 8,000 Å forming source electrode 511 and drain electrode 510.

Although an insulating substrate, such as a quartz substrate was employed in the foregoing description, the substrate may also be of the crystalline type, such as sapphire, $CaF_2$ or the like.

Figure 7:
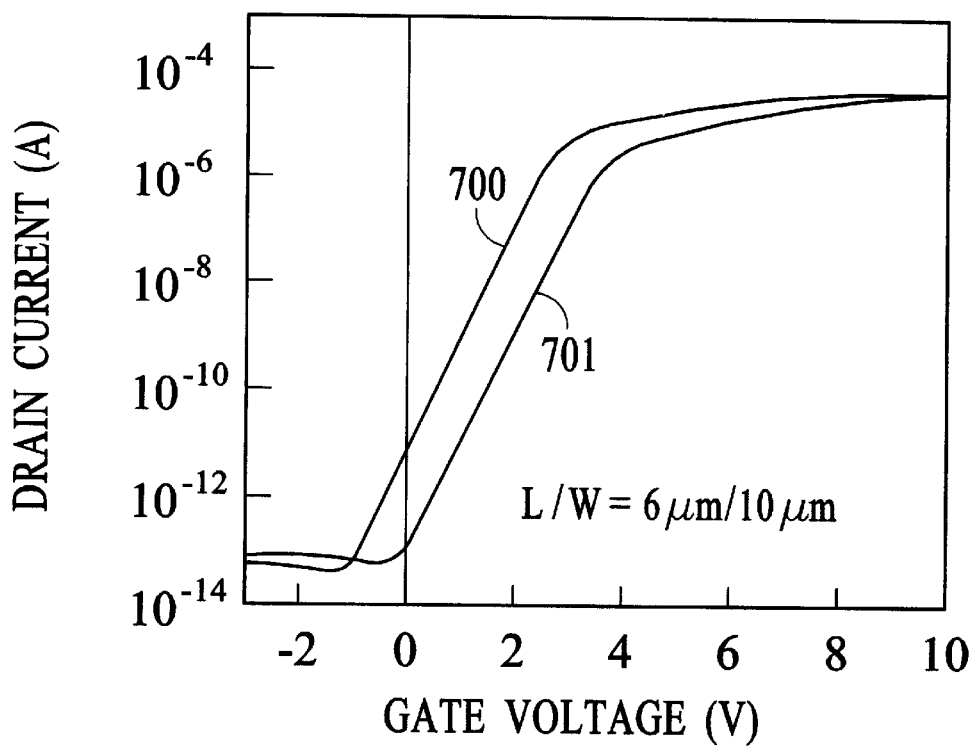
FIG. 7 is graphical illustration of the characteristics of the gate voltage versus the drain current of a n channel TFT comprising this invention.
Figure 8:
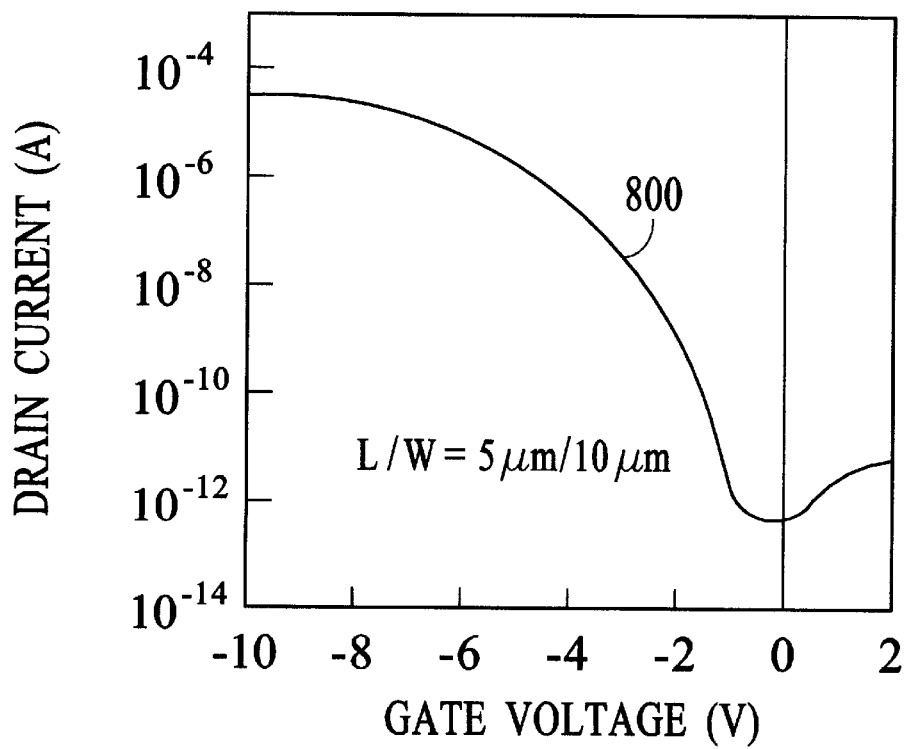
FIG. 8 is graphical illustration of the characteristics of the gate voltage versus the drain current of a p channel TFT comprising this invention.

FIG. 7 and FIG. 8 both illustrate gate voltage versus drain current characteristics of a polycrystalline silicon gate TFT, FIG. 7 with respect to a n channel TFT and FIG. 8 with respect to a p channel TFT. In the case where a p-type polycrystalline silicon gate electrode is employed, the voltage for forming a flat band condition in the structure of gate electrode/insulator film/semiconductor becomes about 1 V higher than in the case where an n-type polycrystalline silicon gate is employed. On the other hand, it is known that conventionally hydrogenated, nondoped polycrystalline silicon shows slight n-type characteristics. For this reason, when an n-type polycrystalline silicon gate electrode is employed in an n channel TFT, a gate voltage 700 would result in an minimum drain current at about −1 V, as illustrated in FIG. 7. On the other hand, when a p-type polycrystalline silicon gate electrode is employed in an n channel TFT, $V_{th}$ shifts to a positive value, and a gate voltage 701 would result in a minimum drain current close to 0 V, as illustrated in FIG. 7: In the case of a p channel TFT, when a n-type polycrystalline silicon gate electrode was employed, a gate voltage which resulted in a minimum drain current was about −0.5 V. However, even in the case where a p-type polycrystalline silicon gate is employed in a p channel TFT, the shift of $V_{th}$ does not occur to the degree that there is an increase in the OFF current. Therefore, good operating characteristics can be obtained as seen for gate voltage 800 illustrated in FIG. 8. Thus, when a p type polycrystalline silicon gate electrode is employed, good TFT characteristics can be obtained in both p channel and n channel TFTs without an increase in the number of process steps employed in fabrication. Therefore, in the case of a $p^+$ polycrystalline silicon gate electrode, channel doping, which is inevitable when an $n^+$ polycrystalline silicon gate electrode is employed as a gate electrode, is unnecessary.

It is to be noted that in connection with the manufacturing method described above relative to FIG. 5, a decrease in interconnect resistance can be easily achieved, particularly when compared with the case wherein formation of polycrystalline silicon is carried out by the prior art method of LPCVD. Therefore, decreasing the gate interconnect resistance, which is a problem in connection with active TFT type large liquid crystal display panels of the prior art, can be easily achieved in accordance with this method thereby lending the application of this invention to the employment in the manufacture of high quality liquid crystal display panels for employment in HDTV.

Also, in the case wherein the method of this invention is applied to a contact type image sensor comprising a scanning circuit and an electro-optic transducer integrated on a same substrate, the application of the method substantially contributes to achieving higher scan rates, higher resolution, and a wider range of gray scale. Further, by decreasing the gate interconnect resistance, it is possible to enlarge the area of a contact type image sensor so that larger size image sensors are possible. In the same manner, applications of the method of this invention in simplifying the fabrication process are applicable to TFT driven liquid crystal shutter arrays, TFT driven thermal heads and the like. Also, the method of this invention is also applicable to three dimensional S01 elements and the like.

Reference is now made to FIG. 6 which is employed to illustrate another example of a manufacturing procedure for a semiconductor device, in particular a TFT structure, according to the method of this invention. In FIG. 6A, a first silicon film 602 is formed on insulating support 601, which may comprise an insulating substrate, such as glass or quartz or the like or an amorphous layer, such as $SiO_2$ or the like. Silicon film 602 is formed by plasma CVD or by a similar means at fairly high temperature in the range of about 400° C. to 800° C. Film 602 may have thickness, for example, in the range of about 50 Å to 1,000 Å. A silicon film formed by plasma CVD at a higher temperature of 400° C. to 800° C. will provide a higher crystalline seed generation rate upon subsequent thermal treatment compared to a case of an amorphous silicon film, such as the type employed for solar cells, formed also by plasma CVD but at a temperature below 350° C. Particularly, if the film formation temperature exceeds about 550° C. , grains with orientation of <110> start to exist, and these grains become seeds upon subsequent thermal treatment thereby creating polycrystalline silicon with a <110> orientation. The formation of film 602 is not limited to this particular method. However, the important point is that it forms a silicon film whose polycrystalline seed generation rate, preferably less than one crystalline seed per 1 $\mu m^2$, by subsequent thermal treatment at about 550° C. to 650° C. is higher than that of a second formed silicon film 603, to be discussed next.

Figure 6A:
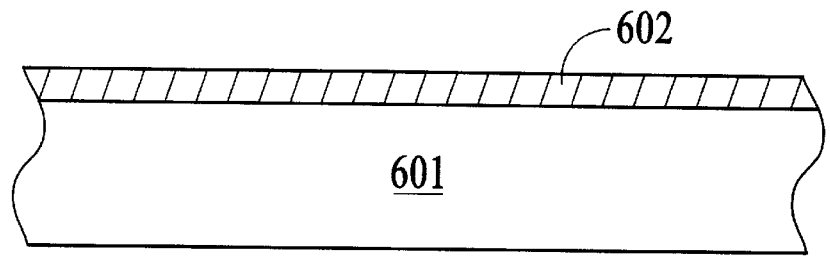
FIGS. 6A–6D illustrate a series of manufacturing steps in the manufacture of a semiconductor device in carrying out a further embodiment of the method comprising this invention.
Figure 6B:
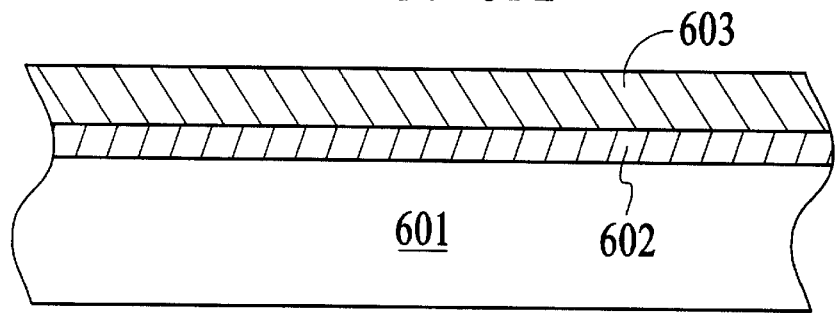
Figure 6C:
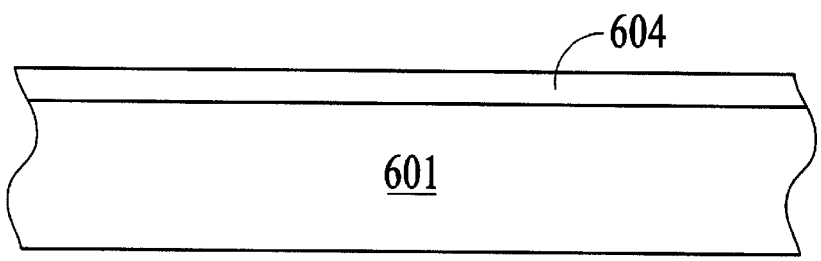

FIG. 6B shows the formation of second silicon film 603 over first silicon film 602. An effective method of forming second silicon film 603 is, for example, by plasma CVD at a relatively low temperature in the range of about 150° C. to 300° C. Film 603 may have a thickness in the range of about 100 Å to 3,000 Å. However, the method of forming film 603 is not necessarily limited to this particular method. The important point is to form a silicon layer whose polycrystalline seed generation ratio is lower than that of first silicon film 602. Polycrystalline seeds would not be generated in a solo film 603 even if subsequent thermal treatment, for purposes of solid phase recrystallization, is carried out in a temperature range of about 550° C. to 650° C. for a period of several tens of hours.

After the formation of first and second silicon films 602 and 603 on support 601, thermal treatment is performed to obtain crystal growth via solid phase recrystallization. The preferred temperature for this thermal treatment differs depending upon how first and the second silicon films 602 and 603 were formed. However, polycrystalline silicon layer 604 is formed by performing thermal treatment in an inert gas atmosphere, such as nitrogen, argon or the like, at a temperature in the range of 550° C. to 650° C. for a period of about 1 to 10 hours, which is notably much less of a required time period than in the case where only a single noncrystalline silicon film is employed.

Also, thermal treatment in an atmosphere containing hydrogen will provide for decreased defect density in film 604, as accomplished in a manner previously explained herein. Thus, in the case of a silicon film formed by plasma CVD, the film will contain a large amount of hydrogen. If appropriate thermal treatment is performed to remove hydrogen prior to solid phase recrystallization thermal treatment, the crystalline quality of polycrystalline film 604 will be improved. For example, films 602 and 603 may be initially thermal treated at a temperature in the range of about 400° C. to 500° C. for a period of about 10 minutes to one hour. The temperature may, then, be brought up to a predetermined temperature in this range fairly quickly. Then, the temperature rise rate is controlled, e.g., 20° C./min or less, to increase the temperature to the solid phase recrystallization treatment temperature in the range of about 550° C. to 650° C. In this connection, any one of the methods for temperature rise rates to the prescribed solid phase recrystallization temperature discussed in connection with FIGS. 2 may be employed in this embodiment.

It is believed that the crystalline growth mechanism occurring relative to dual films 602 and 603 is as follows: First, by performing a short thermal treatment, crystalline seeds are generated in first silicon film 602. Next, during the course of solid phase recrystallization, both first and the second silicon films 602 and 603 are crystallized from these crystal seeds forming polycrystalline silicon film 604 with large grains. In particular, in the case where first silicon film 602 is formed by plasma CVD at a relatively high temperature, e.g., over a temperature, for example, of about 550° C., then, a polycrystalline silicon film having large grains with a <110> orientation will result since the original orientation of the seed grains, that will eventually become large crystalline seeds, is <110>.

Figure 6D:
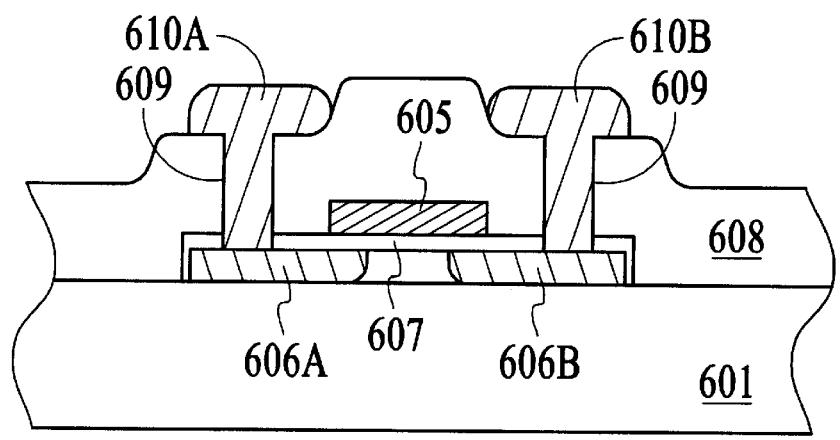

The completion of a semiconductor device, e.g., TFT, after solid phase recrystallization is illustrated in FIG. 6D. Polycrystalline silicon layer 604 is delineated and gate insulator film 607 is formed, for example, by high temperature thermal oxidation, CVD, plasma CVD or the like, wherein the processing temperature is carried out at a low temperature of about 600° C. By employing a low temperature process for the formation of gate insulator film 607, an inexpensive glass substrate can be employed as a substrate, and semiconductor devices, such as TFTs for large liquid crystal display panels and contact type image sensors can be manufactured at low cost. Also, in the case of forming a three dimensional IC structure, semiconductor active elements can be formed on an upper polycrystalline silicon film without incurring undesirable effects, e.g., the diffusion of impurities, into active elements formed in a lower layer.

Next, after formation of gate electrode 605, source and drain regions 606A and 606B are formed, for example, by ion implantation, thermal diffusion, plasma doping or the like. Next, interlevel insulator film 608 is formed, for example, by LPCVD, sputtering, plasma CVD or the like. Further, contact holes 609 are formed in interlevel insulator film 608, and interconnections in the form of contacts 610A and 610B are formed to complete the structure of the TFT.

The field effect mobility of a high temperature processed n channel TFT manufactured according to the method of this invention is greater than about 200 $cm^2$/V·sec thereby providing for a high quality TFT. Also, the field effect mobility of a low temperature processed n channel TFT has been realized in the range of about 100 $cm^2$/V·sec to 150 $cm^2$/V·sec. The field effect mobility is greatly improved in either of these cases compared to the case wherein crystal grain orientation is not controlled so that many grains have a [111] orientation. Further, the $Si/SiO_2$ interface state density in the case of this invention is decreased to half of that compared to TFTs manufactured according to the LPCVD process. This realization is a result of being able to form large grain polycrystalline silicon films with good reproducibility and being able to control crystal grain orientation through the manufacturing method of this invention.

In order to more fully appreciate this invention as described in connection with FIG. 6, a summary of the important considerations and observations taken in account in the practice of this invention will now be described.

The method of both forming a silicon film and the thermal treatment conditions for solid phase recrystallization are optimized in order to form a polycrystalline silicon film with larger grains and a high level preferred grain orientation. First, polycrystalline seed generation density formed by thermal treatment and the time until the generation of polycrystalline seeds are formed will vary depending upon the initial amorphous conditions of the film. Secondly, a silicon film formed by plasma CVD becomes microcrystalline silicon wherein crystalline regions exist in the amorphous phase when rf power and film growth temperature are optimized. In particular, when the film growth temperature is over 400° C., preferably over 550° C., and the applied rf power is optimized, the orientation of crystalline regions will become <110>. Third, even in the case where the film growth conditions are maintained the same, if the film thickness is thinner, then there is a tendency for polycrystalline seed generation density to become low. Fourth, the crystal seed generation rate of an amorphous silicon film formed by vacuum vapor deposition or plasma CVD at a film growth temperature below 400° C. is low. In the case of vacuum vapor deposition, if an amorphous silicon film is formed under the vacuum level of below $10^{-6}$ Pa, at the substrate temperature of about 100° C., very few crystalline seeds are generated after a solid phase la recrystallization treatment at a temperature in the range of about 550° C. to 650° C. for about 10 hours. Also, in the case of plasma CVD, when the film deposition conditions are optimized, such as, a film deposition temperature below about 400° C., preferably below 200° C., and with adjustment of rf power, very few crystalline seeds are generated after a solid phase recrystallization treatment at a temperature in the range of about 550° C. to 650° C. for about 10 hours. Based on the forgoing, the manufacturing method of this invention according to FIG. 6 provides a polycrystalline silicon film with large grains. A key technological point is the enablement of a polycrystalline silicon film with large grains employing a short thermal treatment for solid phase recrystallization by combining a silicon film which possesses a relatively small polycrystalline seed generation rate with a silicon film which possesses a relatively high polycrystalline seed generation rate.

If the natural oxide film existing on a first silicon film 602 is removed when depositing second silicon film 603, there will result a improvement in the overall film quality and the crystalline quality of the film. The oxide film on first silicon film 602 may be removed by a thermal treatment, e.g., in a hydrogen gas atmosphere, in a hydrogen plasma atmosphere or the like, which is performed prior to the formation of second silicon film 603. Also, film quality and crystalline quality are improved if first silicon film 602 and a second silicon film 603 are consecutively formed without breaking vacuum in the film forming apparatus. In particular, in the case wherein both a first and a second silicon films 602 and 603 are formed by PCVD, multiple, in-line, coupled reactive chambers in a continuous film-forming apparatus may be employed to provide for high mass production capabilities. Also, because the film growth temperature for first film 602 is higher than the film growth temperature for second film 603, it is also effective to employ a cooling chamber between the reactive chambers for forming first silicon film 602 and second silicon film 603 to decrease the processing time and thereby increase throughput of the apparatus.

The distinctive characteristics of this invention relative to the embodiment of FIG. 6 will be described by comparing it with examples wherein only a single noncrystalline silicon film is formed by solid phase recrystallization.

The purpose of this invention is to produce large grain polycrystalline silicon by employing a short thermal treatment procedure to provide an overall simple manufacturing method. There is a major drawback in the case of employing a single noncrystalline film in that a much longer thermal treatment is required for solid phase recrystallization. If the temperature of thermal treatment is increased, for example, to over 800° C. in order to shorten the period of thermal treatment, polycrystalline seed generation density will rapidly become too high. Therefore, the largest grain size of polycrystalline silicon that can be achieved in this case is in the range of 200 Å to 300 Å.

Also, when solid phase recrystallization is performed only in connection with a single noncrystalline film, the film thickness cannot be accurately controlled because it would lower the polycrystalline seed generation density. However, when a combined structure, comprising first and second silicon films is employed, the advantage is obtained in being able to control the thickness of first silicon film, which generates crystalline seeds by the subsequent solid phase recrystallization process. In other words, as previously indicated, when the film growth conditions are the same, the thinner the film thickness of the first film, the smaller the formed polycrystalline seed generation density. For example, if a first silicon film 602 is formed with a thin thickness in the range of about 50 Å to 100 Å, the remaining film thickness require for a device structure may be supplied by the addition of the second silicon film thereby enabling the attainment of a composite large grain polycrystalline silicon film 604.

Also, the order of films 602 and 603 may reversed in FIG. 6 wherein silicon film 602 whose crystalline seed generation rate is relatively high may be formed over silicon film 603 whose crystalline seed generation rate is relatively low.

Lastly, as an alternative in the FIG. 6 embodiment, after a first silicon film 602 is initially formed, solid phase recrystallization thermal treatment may then be performed, followed by formation of a second silicon film 603 after which solid phase recrystallization thermal treatment is again performed.

While the invention has been described in conjunction with several specific embodiments, it is evident to those skilled in the art that many further alternatives, modifications and variations will be apparent in light of the forgoing description. Some of the possible alternatives, modifications and variations have already been suggested in the foregoing description. For example, the method of this invention described in connection with FIGS. 1, 4, 5 and 6 is also applicable to the manufacture of other semiconductor active elements and in the manufacture of insulated gate type semiconductor elements in general, e.g., bipolar transistors and static induction type transistors as well as electro-optic transducers, e.g., solar cells and optical sensors. Thus, the invention described herein is intended to embrace at such alternatives, modifications, applications and variations as fall within the spirit and scope of the appended claims.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A method of forming a semiconductor device comprising:

a first step of forming a noncrystalline semiconductor film above a substrate wherein the substrate temperature is in the range of 150° C. to 300° C.; and a second step of forming an insulation film above said semiconductor film by heating said semiconductor film from about 300° C. to 500° C. at a rise rate not higher than 20° C. per minute, and heating said semiconductor film from about 500° C. to a predetermined temperature of about 1000° C., or more, at a rise rate not higher than 5° C.

2. The method of claim 1 wherein said semiconductor film is comprised primarily of silicon.

3. The method of claim 1 wherein said insulation film is formed in an atmosphere containing at least one of oxygen, hydrogen chloride, and water vapor.

4. The method of claim 1 wherein said predetermined temperature is in the range of 1000° C. to 1200° C.

5. The method of claim 1 wherein said semiconductor film is heated from 300° C. to 500° C. at a rise rate not lower than 10° C. per minute.

6. The method of claim 1 wherein said second step of forming an insulation film includes at least one heat annealing stage during the heating of said semiconductor film to said predetermined temperature.

7. The method of claim 6 wherein said heat annealing stage includes maintaining said semiconductor film at an intermediate temperature plateau for an annealing period before continuing to raise its temperature up to said predetermined temperature.

8. The method of claim 7 wherein said annealing period is in the range of 10 to 60 minutes.

9. The method of claim 8 wherein the temperature rise rate prior to said annealing stage is substantially equal to the temperature rise rate after said annealing stage.

10. The method of claim 7 wherein said intermediate temperature plateau is in the range of 700° C. to 900° C.

11. The method of claim 6 wherein said heat annealing stage includes an annealing period during which the temperature rise rate is reduced to an annealing rise rate lower than the rise rate prior to said heat annealing stage.

12. The method of claim 11 wherein said annealing rise rate is at most 5° C. per minute.

13. The method of claim 1 wherein said semiconductor film is heated from 300° C. to 500° C. at a rise rate not higher than 10° C. per minute.

* * * * *